United States Patent
Kawashima

(10) Patent No.: US 8,665,628 B2
(45) Date of Patent: Mar. 4, 2014

(54) FERROELECTRIC MEMORY DEVICE

(75) Inventor: Shoichiro Kawashima, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 221 days.

(21) Appl. No.: 13/213,396

(22) Filed: Aug. 19, 2011

(65) Prior Publication Data

US 2012/0127776 A1 May 24, 2012

(30) Foreign Application Priority Data

Nov. 22, 2010 (JP) .................................. 2010-259854

(51) Int. Cl.
*G11C 11/22* (2006.01)

(52) U.S. Cl.
USPC ............................ 365/145; 365/203; 365/205

(58) Field of Classification Search
USPC .......................................... 365/145, 203, 205
See application file for complete search history.

(56) References Cited

U.S. PATENT DOCUMENTS

| | | | |
|---|---|---|---|
| 6,487,103 | B2 | 11/2002 | Yamamoto et al. |
| 6,549,449 | B2 | 4/2003 | Takashima |
| 7,012,829 | B2 | 3/2006 | Kawashima et al. |
| 7,525,846 | B2 | 4/2009 | Morita et al. |
| 7,729,181 | B2 | 6/2010 | Morita et al. |
| 2002/0136049 | A1* | 9/2002 | Choi et al. ..................... 365/145 |
| 2009/0168577 | A1 | 7/2009 | Morita et al. |

FOREIGN PATENT DOCUMENTS

| | | | |
|---|---|---|---|
| JP | 9-121032 | A | 5/1997 |
| JP | 2001-358312 | A | 12/2001 |
| JP | 2002-133857 | A | 5/2002 |
| JP | 2002-197855 | A | 7/2002 |
| JP | 2005-293818 | A | 10/2005 |
| JP | 2007-257692 | A | 10/2007 |
| JP | 4031904 | B2 | 1/2008 |
| JP | 2008-059676 | A | 3/2008 |
| JP | 2008-234829 | A | 10/2008 |
| JP | 4157528 | B2 | 10/2008 |
| JP | 4185969 | | 11/2008 |
| JP | 2009-123328 | A | 6/2009 |

OTHER PUBLICATIONS

Kawashima, Shoichiro et al., "Bitline GND Sensing Technique for Low-Voltage Operation FeRAM", IEEE Journal of Solid-State Circuits, vol. 37, No. 5; May 2002.

* cited by examiner

Primary Examiner — Hoai V Ho
(74) Attorney, Agent, or Firm — Fujitsu Patent Center

(57) ABSTRACT

A ferroelectric memory device has word, bit, plate lines; memory cells having access gate and ferroelectric capacitor; latch amplifier for latching stored data; and write amplifier for driving bit lines according to write data. The bit lines are precharged to a reference potential before an active period. In active period, at a first time, selected word line and plate line are driven to a high-level potential so that ferroelectric capacitor output electric charge to selected bit line, and at a second time, selected bit line is brought to reference potential regardless of write data so that first data is written to selected memory cell, and at a third time, plate line is driven to reference potential and is maintained; and in a precharge period, the write amplifier drives selected bit line to high-level potential according to write data so that second data is written to selected memory cell.

15 Claims, 18 Drawing Sheets

FIG. 11    DELAYED WRITE BGS METHOD FeRAM WRITING

FERROELECTRIC MEMORY DEVICE

CROSS-REFERENCE TO RELATED APPLICATIONS

This application is based upon and claims the benefit of priority of the prior Japanese Patent Application No. 2010-259854, filed on Nov. 22, 2010, the entire contents of which are incorporated herein by reference.

FIELD

This invention relates to a ferroelectric memory device.

BACKGROUND

Random access memory (RAM) is classified into synchronous and asynchronous types. Synchronous RAM latches an address and write data in response to the falling of a chip select signal /CS, for example, accesses the address and executes writing of the latched data.

On the other hand, asynchronous RAM continually operates and after a period an address stays fixed, an access cycle is started, write data is latched in response to the rising of the chip select signal /CS, and writing of the data is executed. Operation of such asynchronous RAM was coordinated with older-generation CPUs, which output the data of a computation result in the second half of a clock cycle. The write method of such asynchronous RAM is called the delayed write method.

Ferroelectric memory (FeRAM) also has synchronous type and pseude-asynchronous type in which address is latched at falling edge of /CS and DATA is not latched thereat. In ferroelectric memory, a memory cell comprises an access gate and a ferroelectric capacitor; data is held through the direction of polarization of the ferroelectric capacitor. When, during readout, a plate line connected to a ferroelectric capacitor is driven to H level, the stored data is read out according to whether there is no change produced by the polarization direction of the ferroelectric capacitor being not changed and the electric charge amount output to bit line is small (for example, data 0), or a change occurs by the polarization direction of the ferroelectric capacitor being changed and and the charge amount is large (for example, data 1).

Further, bit-line termination while the plate line rise of ferroelectric memory is classified into the HiZ method and the BGS (Bit-Line GND Sense) method according to the readout method. In the readout operation of the HiZ method, a bit line is put into a floating state at a precharge level, a word line is selected to cause an access gate to be conducting, and by driving a plate line to H level, the bit line potential is made to change according to the charge amount output by the ferroelectric capacitor in the memory cell. This bit line potential is amplified by a latch amplifier, and brought to either the power supply VDD level or ground GND level. This amplified bit line potential is output as the readout data. Rewriting is performed by driving the plate line to H level or L level while maintaining the bit line potential.

During a write operation in the case of the HiZ method, after the latch amplifier amplifies the bit line potential, a write amplifier drives the bit line potential to the power supply VDD level or GND level according to the write data, the plate line is driven to H level then to L level, and by forming a polarization state in the ferroelectric capacitor, data 0 or 1 is written. If the bit line is at H level and the plate line is at L level, data 1 is written, and if the bit line is at L level and the plate line is at H level, data 0 is written.

In the BGS method, the bit line is fixed at GND level by a input terminal of a QV amplifier, the QV preamplifier amplifies the magnitude of the charge amount output to the bit line when plate line is driven and the charge is converted into a voltage difference at a output terminal of the QV amplifier, and then further amplified to the power supply level or GND level by a latch amplifier. Rewriting is performed by using the write amplifier to drive the bit line and driving the plate line to H level or L level. Write operations are equivalent to rewrite operations.

Ferroelectric memory is disclosed in Japanese laid-open patent publications 2002-197855, H09-121032, 2009-123328, 2001-358312, Japanese registered patents 4031904, 4157528, 4185969, Japanese laid-open patent publications 2002-133857, 2005-293818, 2007-257692, 2008-59676, 2008-234829, and non-patent document, S. Kawashima et al. "Bit-line GND sensing technique for low-voltage operation FeRAM," IEEE J. SC, Vol. 37, no.5, pp. 592-598, May. 2002.

In the case of the delayed write method, using either the HiZ method or the BGS method, by word line selection, plate line driving, sense amplifier operation and similar, a bit line level is brought to the power supply level or GND level, and after a state in which the plate line has remained at H level has continued, the write data is latched and the write operation is performed. When the active period becomes long and this suspending state is continued for a long time, if the threshold voltage of the access gate of a half-selected cell is low due to manufacturing variances, the node within a half-selected cell connected in common to the selected plate line at H level and with bit line at L level, or the capacitor terminal node within half-selected cells that are cells connected in common to the bit line at the power supply level and with plate line at L level, may become the bit line level due to a leak from the access gate, so that the polarization state of the ferroelectric capacitor is reversed and erroneous writing occurs.

SUMMARY

One aspect of embodiments is a ferroelectric memory device, comprising: a plurality of word lines; a plurality of bit lines intersecting the word lines; a plurality of plate lines; a plurality of memory cells which are disposed at the positions of intersection of the word lines and bit lines, and which respectively have an access gate which connects to the word line and the bit line, and a ferroelectric capacitor provided between the access gate and the plate line; a latch amplifier, which latches stored data according to an amount of charge output to the bit lines from the ferroelectric capacitors; and a write amplifier, which drives the bit lines according to write data or according to the latched stored data, wherein the bit lines are precharged to a reference potential by the beginning of an active period; in the active period, at a first time a selected word line is driven according to an input address, and the plate line is driven from a reference potential to a high-level potential so that the ferroelectric capacitor is caused to output electric charge to the selected bit line, and thereafter at a second time, the selected bit line is brought to the reference potential regardless of the write data or the latched stored data so that first data is written to the selected memory cell, and thereafter at a third time, the plate line is driven to the reference potential and is maintained at the reference potential together with the selected bit line; and in a precharge period after the active period, the write amplifier drives the selected bit line from the reference potential to a high-level potential if the write data or the latched stored data is high-level so that second data is written to the selected memory cell.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
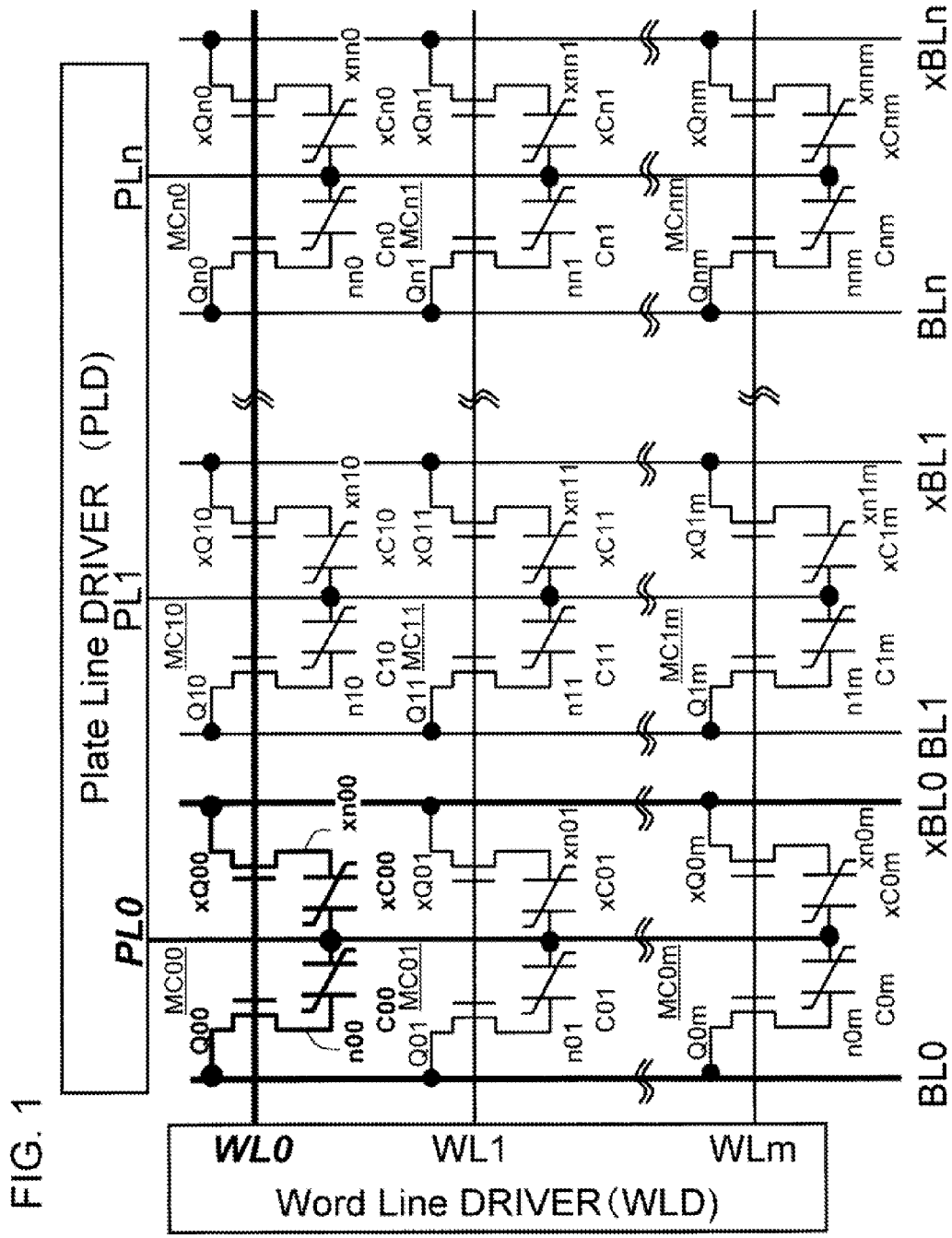
FIG. 1 depicts a memory array of ferroelectric memory in an embodiment.

FIG. 1 depicts a memory array of ferroelectric memory in an embodiment. This memory array applies both the HiZ method and the BGS method; in this example, a memory cell is an example of a two-transistor, two-capacitor (2T2C) design having two access gates and two ferroelectric capacitors.

The memory cell array has a plurality of word lines WL0 to WLm extending in the row direction, a plurality of bit line pairs BL0, xBL0 to BLn, xBLn extending in the column direction, and a plurality of memory cells MC00 to MCnm provided at the positions of intersection thereof. A memory cell MC00 has a pair of access gates Q00, xQ00 comprising NMOSFETs the gates of which are connected to a word line WL0, and a pair of ferroelectric capacitors C00, xC00 connected thereto. The access gates Q00, xQ00 connect the bit line pair BL0, xBL0 and the ferroelectric capacitors C00, xC00 when the word line WL0 is driven to H level, which is the power supply VDD level.

In the example of FIG. 1, plate lines PL0 to PLn are provided extending in the column direction parallel to the bit line pairs, and connected to one of the electrodes of the ferroelectric capacitors within each memory cell.

As explained below, plate lines may also be disposed extending in the row direction.

The plurality of word lines WL0 to WLm are driven to for example L level at GND level and H level at the power supply VDD level by a word line driver circuit WLD, and are also driven to a boosted-voltage level, higher than the power supply level, during a write operation. The plurality of plate lines PL0 to PLn are driven to for example L level at GND level and H level at the power supply voltage VDD level by a plate line driver circuit PLD.

Further, the nodes n00, xn00 within the memory cell MC00 are nodes for connection to the access gates Q00, xQ00 and the ferroelectric capacitors C00, xC00.

In FIG. 1, when the word line WL0 is selected, the access gates Q00, xQ00 of the memory cell MC00 are turned on, and the bit lines BL0, xBL0 and ferroelectric capacitors C00, xC00 are connected. By driving the plate line PL0 so as to impart positive-negative capacitor polarization storage potential difference between the bit lines BL0 and xBL0, their potential difference is imparted to the ferroelectric capacitors C00 and xC00, and the two capacitor's storage polarization directions are complementary.

In the other half-selected cells MC01, MC0m connected to the plate line PL0, the word lines WL1 to WLm are at the non-selected GND level, and so the access gates Q01 to Q0m and xQ01 to xQ0m are turned off. Hence even when the potential of the plate line PL0 rises, the potential of the internal nodes n01 to n0m and xn01 to xn0m, which are floating nodes, rises through capacitive coupling of the capacitors, so that an additional potential difference does not occur across the electrodes of the ferroelectric capacitors C10 to Cn0 and xC10 to xCn0, and the polarization direction, that is, the stored data in these half-selected memory cells is retained.

On the other hand, in the half-selected cells MC10, MCn0 connected to the selected word line WL0, the access gates Q10 to Qn0 and xQ10 to xQn0 are turned on, but the plate lines PL1 to PLn and bit line pairs BL1 to BLn and xBL1 to xBLn are both fixed at GND level, so that an additional potential difference does not occur across the electrodes of the ferroelectric capacitors C01 to Cn0 and xC01 to xCn0, and the polarization direction, that is, the stored data in these memory cells is retained as well.

(First Embodiment: HiZ Method)

Figure 2:
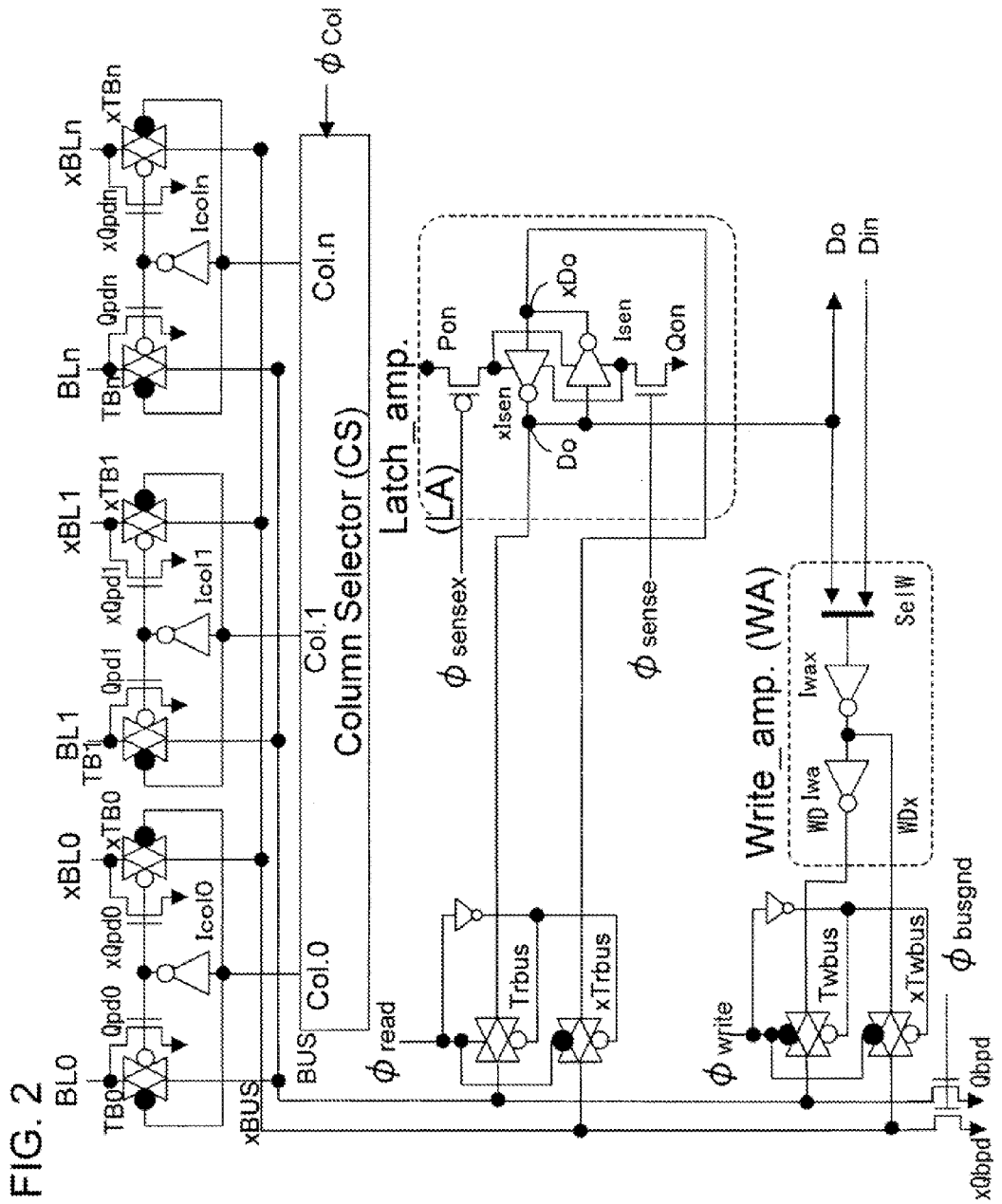
FIG. 2 depicts the configuration of column transfer gate and column selector, data bus, and latch amplifier and write amplifier connected thereto in a HiZ method FeRAM.

FIG. 2 depicts the configuration of column transfer gate and column selector, data bus, and latch amplifier and write amplifier connected thereto in a HiZ method FeRAM.

The bit lines BL0 to BLn and xBL0 to xBLn are coupled to the bit lines in the memory array of FIG. 1. By means of for example a column selection signal COL.0 selected by the column selector CS, bilateral gates TB0, xTB0 comprising PMOSFET and NMOSFET parallel transfer gates are turned on, the bit line BL0 is connected to the data bus BUS, and the bit line xBL0 is connected to the data bus xBUS. The NMOSFETs Qpd0 and xQpd0 which precharge the bit line pair BL0, xBL0 to GND level are turned off in the selected column. In order to precharge the bit lines of the selected column to GND level, NMOSFETs Qbpd and xQbpd, which is controlled to be on/off by means of a bus ground signal φbusgnd, are connected to the data buses BUS, xBUS.

On the other hand, in unselected columns the bilateral gates TB1 to TBn and xTB1 to xTBn are turned off, and the bit line pairs BL, xBL are detached from the data buses BUS, xBUS. Further, the NMOSFETs Qpd and xQpd which precharge the bit line pair BL, xBL to GND level are turned on in unselected columns, and so the bit line pairs in unselected columns are all fixed at GND level.

The data buses BUS, xBUS are connected to the latch amplifier LA by bilateral gates Trbus, xTrbus which are controlled by a control signal φread.

The latch amplifier LA is switched on/off by control signals φsensex and φsense. In the state in which φsensex=VDD level and φsense=GND level, the upper and lower nodes of the cross-coupled circuit of CMOS inverters xIsen and Isen are disconnected from the power supply VDD and from ground GND by a PMOSFET Pon and an NMOSFET Qon, respectively the bilateral gates Trbus and xTrbus are turned on by the control signal φread, the node Do in the latch amplifier and the data bus BUS are connected and xDo and xBUS are connected, and the voltage level occurring in the bit line pair is captured.

On the other hand, upon switching to φsensex=GND level and φsense=VDD level, the MOSFETs Pon and Qon in the latch amplifier LA are turned on, and the nodes Do, xDo are amplified to the levels of the power supply VDD and ground GND. With the control signal φread=H level and the data buses BUS, xBUS remaining connected, the latch amplifier LA amplifies the levels of the data buses and selected bit line pair, and in the READ cycle these can be rewritten to the memory cell without modification.

The latch amplifier LA extracts normal output from the node Do, and transmits this to the FeRAM output during reading, and retains the data. The write amplifier WA drives the data bus pair and bit line pair according to this retained data, to perform rewriting of the memory cell.

The write amplifier WA has an input selector SeIW; during rewriting, the output Do of the latch amplifier is selected, and in a write cycle the data input Din is selected. By means of the control signal φwrite, the normal output WD is connected to the data bus BUS by the bilateral gate Twbus, and the complementary output WDx is connected to the data bus xBUS by the bilateral gate xTwbus.

All transfer gates comprise bilateral gates in order to pass all potentials from the power supply level VDD to ground level GND.

(Long Active Periods)

Figure 3:
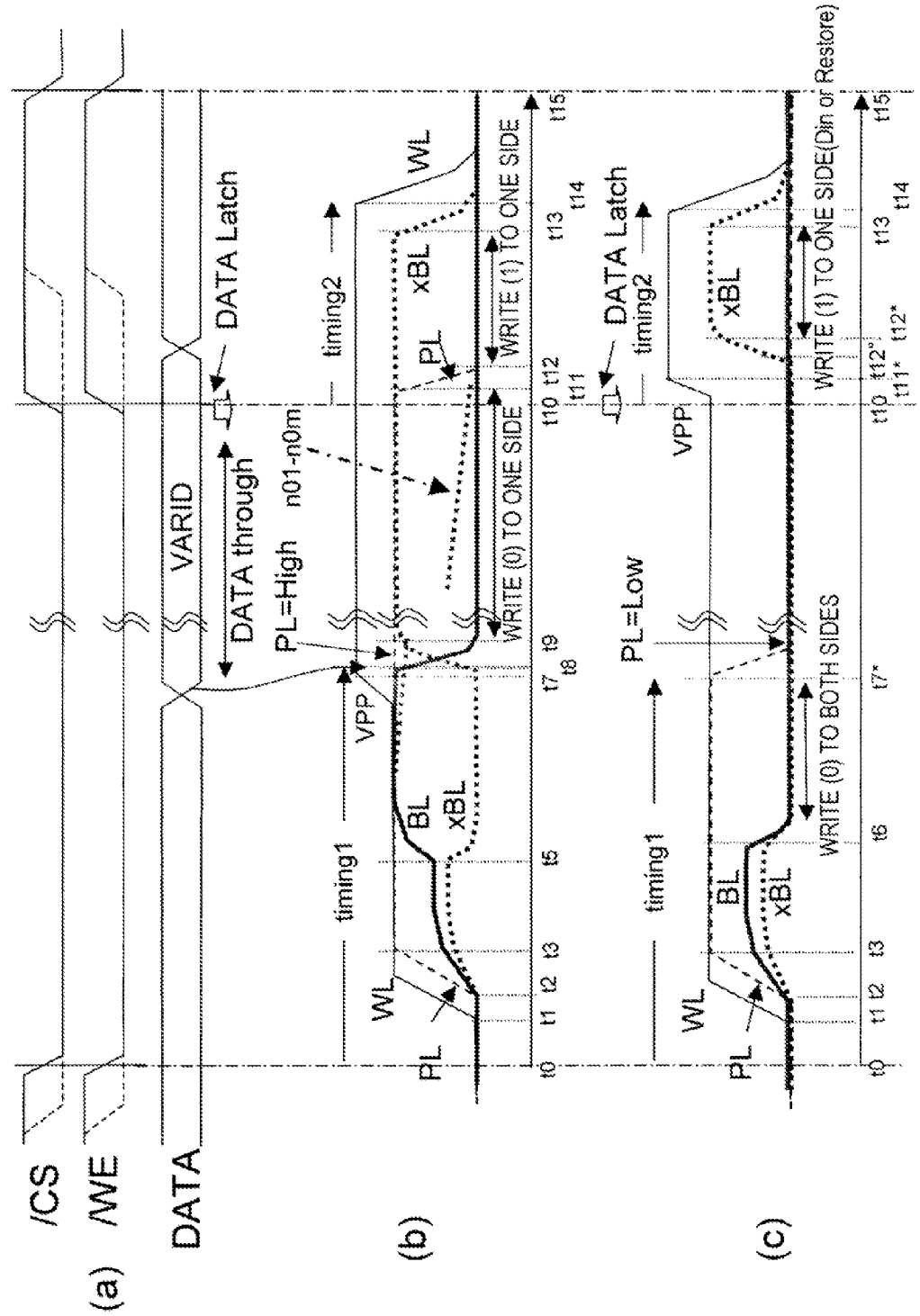
FIG. 3 depicts write operation for delayed-write type HiZ read-method FeRAM in this embodiment.

FIG. 3 depicts write operation for delayed-write type HiZ read-method FeRAM in this embodiment. In particular, an example of a long active period is depicted. FIG. 3 depicts an external input signal to the memory chip (a), problematic write operation (b), and the write operation of this embodiment (c).

In (b) and (c) of FIG. 3, the driving waveforms of the word lines WL, plate lines PL, and positive-logic bit lines BL as well as negative-logic bit lines xBL in a complementary relationship therewith, all within the internal cell array, are depicted. In the figure, WL, PL, BL, and xBL indicate signals connected to a selected memory cell in the cell array. The configuration of the cell array assumes the 2T2C-design memory cells, with plate lines PL parallel to bit lines BL, of FIG. 1.

Figure 4:
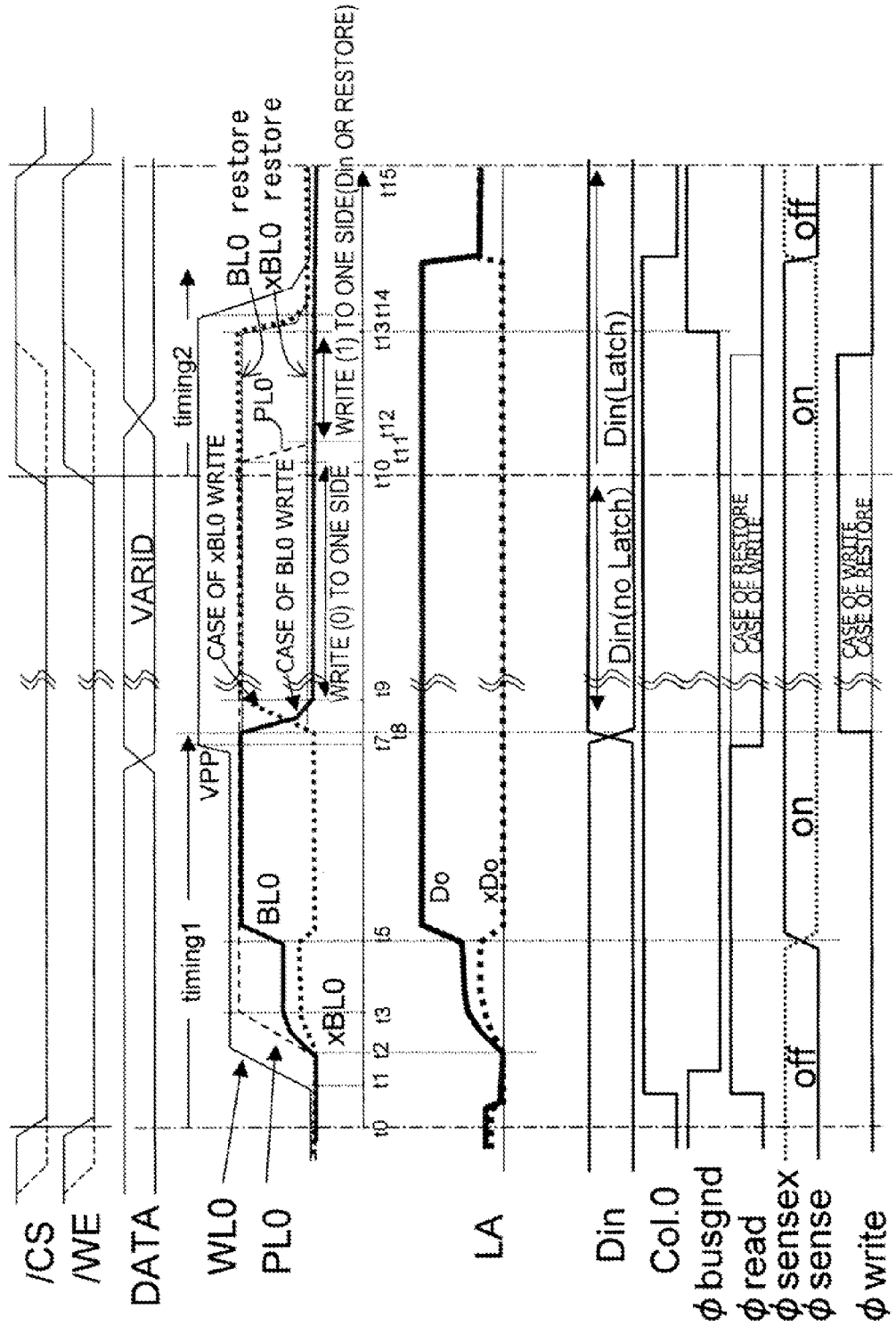
FIG. 4 is a detailed waveform figure including the sense system and write system operation in (b) of FIG. 3.
Figure 5:
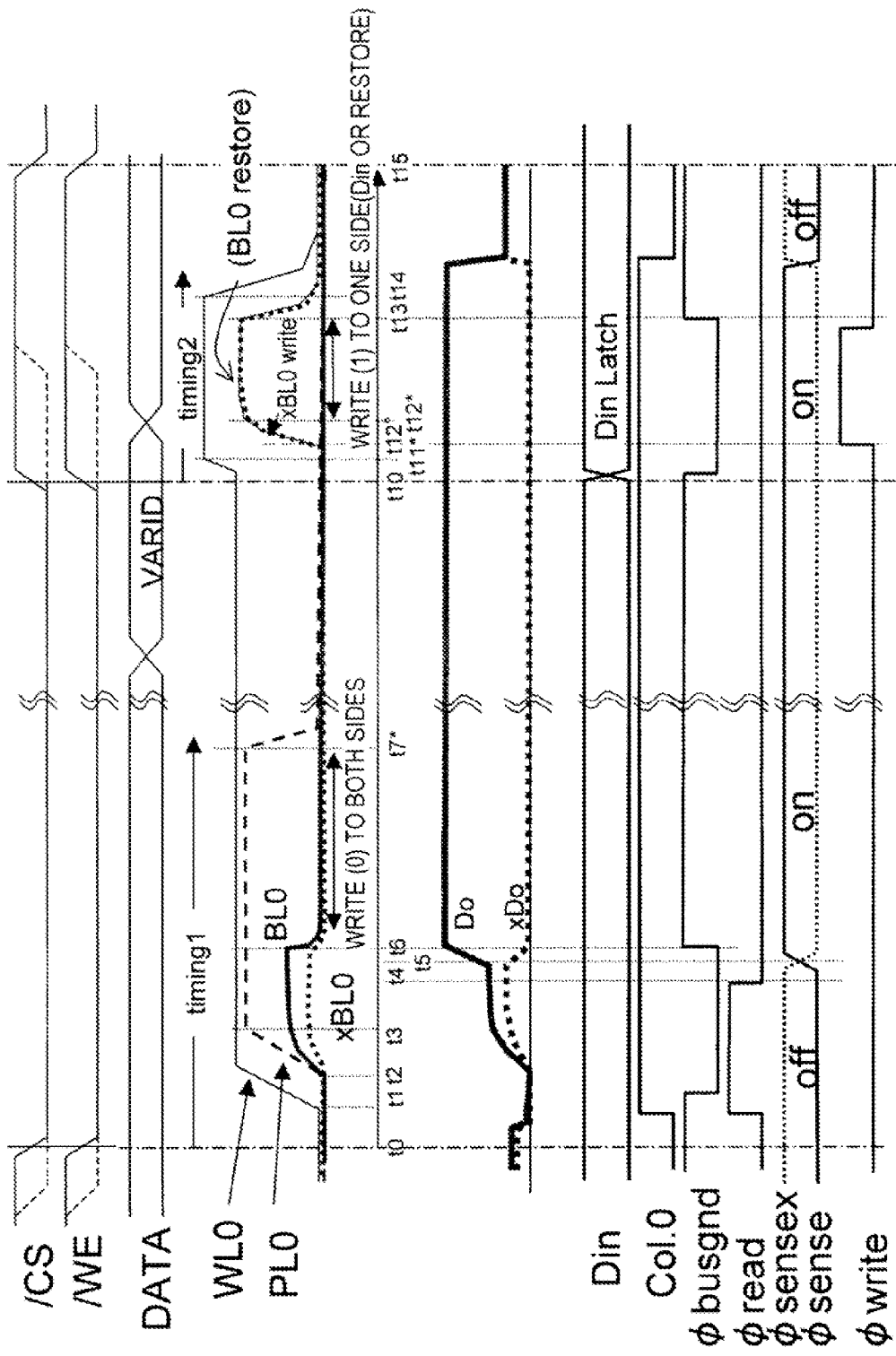
FIG. 5 is a detailed waveform figure including the sense system and write system operation in (c) of FIG. 3.

Further, FIG. 4 is a detailed waveform figure including the sense system and write system operation in (b) of FIG. 3. And, FIG. 5 is a detailed waveform figure including the sense system and write system operation in (c) of FIG. 3. Below, a problematic write operation and a write operation of this embodiment in a delayed-write type HiZ method are explained referring to FIG. 3, FIG. 4 and FIG. 5.

In delayed writing in FIG. 3, the address is input with the timing of the falling of the chip select signal /CS, and based on this input address an operation to access the memory cell is begun, and the write data is captured with the timing of the rising of either the chip select signal /CS or the write enable signal /WE, whichever is earlier. Further, the active period begins with the falling of the chip select signal /CS, and ends with the rising thereof. After the active period is the precharge period.

Problematic write operation is illustrated in (b) of FIG. 3 and FIG. 4. The active period of the FeRAM chip is begun from the timing t0 of the falling of the chip select signal /CS. At time t1 the word line WL rises, and when the plate line PL rises from t2 to t3, charge flows from the ferroelectric capacitors of the selected cell, in an amount corresponding to the polarization direction thereof, to the bit lines BL, xBL. When data is (0) up to time t2, a small amount of charge equivalent to a linear capacitance flows to the bit line pairs BL, xBL, and when the data is (1) up to time t2, a large amount of charge corresponding to the linear capacitance+polarization inversion charge (reversal from 1→0), flows to the bit line pairs BL, xBL. The bit line pair is precharged to GND level until time t2, and is in a floating state, so that the potentials of the bit line pair BL, xBL rise to the voltages resulting from charge distribution between the bit line capacitance and cell capacitance. At and after time t3, after the potential of the plate line PL has been rised, the bit line potentials are substantially stable, although depending on the reversal response time of the ferroelectric capacitors. In the example of (b) in FIG. 3, the potential of the bit line BL rises higher than that of the bit line xBL.

In the HiZ method circuit configuration depicted in FIG. 2, the selected bit line pair BL, xBL is connected to the latch amplifier LA via the column transfer gates TB, xTB, the data buses BUS, xBUS, and the switches Trbus, xTrbus, and sensing and amplification of the signals of the bit line pair are performed by the latch amplifier LA. That is, in (b) of FIG. 3, when at time t5 the latch amplifier LA is turned on and begins amplification, the bit lines BL, xBL go to the potentials of the power supply voltage VDD and ground GND.

At time t7 the word line WL is boosted to a raised level VPP, higher by the threshold voltage or more than the power supply voltage VDD, and from time t8, write amplifier driving begins according to the external write data Din. In the example of (b) of FIG. 3, write data Din which is invert of the stored data of the memory cell is input, and through driving of the write amplifier WA the levels of the bit line pair BL, xBL are inverted.

At time t9 the plate line is at PL=VDD level, and so on the side of the bit line BL driven to L level, writing of data (0) is performed. Here, the first timing sequence, which had begun with the falling of the chip select signal /CS, ends. And in the case of a long active period, between times t9 and t10, in the state in which the word line WL is at the raised VPP level, the plate line PL=VDD level, the bit line BL=GND level, and the bit line xBL=VDD level, the suspending state is entered.

In this suspending state, in the half-selected cells MC01 to MC0m in the same column as the selected cell MC00, the plate line is at PL=VDD level and the word line is at WL=GND level, so that through the coupling action of the capacitors, the capacitor nodes n01 to n0m in these half-selected cells are at the power supply VDD level. However, if there are access gates Q01 to Q0m with thresholds near Vth=0, the leakage current may cause the capacitor nodes n01 to n0m in these cells to fall toward the ground GND level of the bit line BL, and ultimately fall to GND level, as indicated by the dashed line indicated by the dot-dash arrow n01-n0m in the figure. As a result, the plate line is at PL=VDD level and the capacitor nodes are at n01-n0m=GND level, the write voltage for data (0) is applied to the ferroelectric capacitors, and the data retained in the half-selected cells may be destroyed. This is a problem with delayed-write type writing when using the HiZ method. This problem similarly occurs when the plate line PL is lowered to GND level because a data (1) write voltage is applied to the side of the bit line xBL=VDD. Further, this problem similarly occurs even when the write data Din is the no inverted data of the stored data.

At time t10, at the rising of the chip select signal /CS or write enable signal /WE, whichever is earlier, the write data Din is captured and latched. Further, at the rising of the chip select signal /CS the active period ends. And, from time t10 a second timing sequence is started. At time t11 the potential of the plate line PL falls, and in the state with the plate line PL=GND and bit line xBL=VDD, a state is entered of writing data (1) to the ferroelectric capacitor xC00 within the selected cell. At time t13 the potential of the bit line xBL falls, and at time t14 the potential of the word line WL falls and the second timing sequence ends.

In the above period t9 to t11, the plate line PL=VDD level and the bit line BL=GND level, so that in this period data (0) is written to the bit line BL and selected capacitor. Further, the period from time t12 at which the plate line PL goes to GND level until time t13 at which the bit line xBL is at VDD level is a period in which data (1) is written to the bit line xBL and selected capacitor.

In the delayed writing of (b) in FIG. 3, at times t5 to t7 the bit line pair is driven to the power supply voltage VDD and to ground GND, and only one of the bit lines, xBL, is at GND level, so that due to the plate line PL=VDD, data (0) is written only to the ferroelectric capacitor on the bit line xBL side, and data (0) is not written to the side of the bit line BL. Hence at the times t9 to t10 when the write amplifier within the chip operates according to the external write data and the bit line BL is driven to GND level, it becomes necessary to write data (0) to the side of bit line BL. If the time t9 to t10 for writing of data (0) becomes too long, stored data in half-selected cells may be destroyed, as explained above.

Half-selected cells in which stored data is destroyed are cells which have the plate line PL in common with the selected cell, and are cells in which the word line WL is not driven to VDD level. Hence even when plate lines PL are provided in the row direction, in cases where a plate line is shared by, for example, memory cells MC00, MC01 and the memory cells MC01, MC11 in the row adjacent thereto, and even in cases where plate lines are disposed in a cyclic manner (oblique direction), as described in Japanese Patent Laid-open No. 2009-123328 and Japanese Patent Laid-open No. 2001-358312, such half-selected cells exist.

The above-described problem of erroneous writing of data (0) to half-selected cells also occurs during asynchronous type read operations when the active period is long. In (b) of FIG. 3 and FIG. 4, when the write enable signal /WE does not fall, a read operation occurs. In this case also, in half-selected cells during the times t9 to t11, the bit line pair is driven to VDD level and GND level, and the plate line PL is being maintained at VDD level, so that if the access gate threshold is near 0 V, leak operation causes the internal node corresponding to the GND level bit line to fall to GND level, and due to the VDD level on the plate line PL, erroneous data (0) writing occurs. And when at time t11 the plate line PL falls, rewriting of data (1) is performed in the selected cell.

Delayed writing of this embodiment using the HiZ method is depicted in (c) of FIG. 3 and FIG. 5. In this case, in the suspending state t7* to t10 of a long active period, it is controlled to be PL=BL=xBL=GND level. By this means, even if the access gate threshold Vth is near 0 V in half-selected cells, the plate line PL=GND level and the bit line pair BL=xBL=GND level, so that the voltage VDD-GND is not applied across the electrodes of the ferroelectric capacitors, and there is no reversal of the stored polarization states. In this embodiment also, it is assumed that the memory array is as in FIG. 1 and that the HiZ method circuit configuration is as in FIG. 2.

In this embodiment also, as depicted in (c) of FIG. 3, the bit line pair is precharged to GND level from the precharge period to t0. And, the period from the timing t0 of the falling of the chip select signal /CS to the timing of the signal rising t10 is the active period, and from t10 is the precharge period. Further, the write signal Din (DATA) is captured within the chip at the rising edge of the write enable signal /WE at t10. When there is no write enable signal /WE falling edge, a readout operation occurs.

First, in (c) of FIG. 3, the period from time t0 to t3 is the same as in (b) of FIG. 3. However, after the charge of the cell is output to the bit line pair, a potential difference occurs on the bit line pair, and this is transmitted to the nodes Do, xDo of the latch amplifier, at time t4 the gates Trbus, xTrbus are turned off and the data buses BUS, BUSx are separated from the latch amplifier LA. Further, at time t6 the NMOSFETs Qbpd, xQbpd are turned on, and the bit lines BL, xBL are both brought down to GND level. And, the latch amplifier LA discriminates and retains the readout DATA. This is described in detail below.

Further, in the interval between times t6 and t7*, it is controlled to be the plate line PL=VDD level and both bit lines BL=xBL=GND level, and by this means, writing of data (0) to both ferroelectric capacitors in the selected cell is performed. This data (0) writing is performed regardless of the stored data in the cell or Din data during write cycle. And, at time t7*, in the state in which the plate line PL is brought down to GND level and the word line WL is held at VDD level, the first timing sequence ends, and the suspending state of the long active period t7* to t10 is entered. In this suspending state, the bit line pairs BL, xBL of the selected cell and unselected cells are at GND level, and the plate line PL is also at GND level. Hence in half-selected cells which are cells which share the plate line PL with the selected cell, and the word line WL for which is at GND level, even if for example an access gate threshold is near 0 V, there is no destruction of stored data. Further, in half-selected cells for which the word line WL=VDD also, since the unselected bit line pairs are BL=xBL=GND, and the plate line is PL=GND, therefore the stored data is protected.

When the external write data is captured with the timing at t10 of the rising of either the chip select signal /CS or the write enable signal /WE, whichever is earlier, and the precharge period is entered from the rising of the chip select signal /CS, the second timing sequence is started. First, at time t11* the word line WL is boosted to raised level VPP, higher than VDD by the threshold voltage or more, and from time t12* to time t13 the bit line xBL is driven to the VDD level by the write amplifier, and writing of data (1) is performed. There are also cases in which the other bit line BL is driven to the VDD level according to the captured write data.

Then, at time t14 the potential of the word line WL falls, and the second timing sequence ends. In the read cycle, rewriting is performed with one of the bit lines, BL or xBL, at the VDD level according to the previously latched readout data, conforming to the second timing sequence.

The examples of (b) and (c) in FIG. 3 were explained assuming a 2T2C memory cell; but similarly for memory cells with a 1T1C configuration comprising one access gate and one ferroelectric capacitor, after the end of the first timing sequence, a method of suspending over a long active period with PL=BL=xBL=GND level can be applied.

FIG. 4 is a detailed waveform diagram of the problematic HiZ method delayed writing of (b) in FIG. 3. Here the main sense and write system signals of FIG. 2 and control signals for these have been added to (b) of FIG. 3. The nodes Do, xDo of the latch amplifier LA are connected to the data buses BUS, xBUS by the control signal φread=H level at and before time t2. And from times t2 to t3, during rising of the plate line PL potential, charge arisen in the cell capacitor is distributed to the capacitances of the bit line pair and data bus pair and the cell capacitors so as to increase the nodes Do and xDo in the latch amplifier LA. At time t5, when the latch amplifier control signals switch to φsensex=GND level and φsense=VDD level and the latch amplifier is activated, the nodes Do, xDo are latch amplified to the power supply voltage VDD and to GND. During this interval, the nodes Do, xDo are connected to the data bus pair BUS, xBUS and to the bit line pair, and so the amplitude operations of the nodes Do, xDo are conveyed to the bit line pair.

Immediately before time t8, the control signal φread goes to GND level, the gates Trbus, xTrbus are turned off, and the data bus pair and latch amplifier are separated. And at time t7 the potential of the word line WL rises to the raised level VPP, higher than the power supply voltage VDD by the threshold Vth or more. Further, at time t8, with the control signal φwrite=VDD level, when the data bus pair is driven by the write amplifier WA according to the external write data Din, because the plate line is at PL=VDD level, according to the bit line BL0=GND level, writing of data (0) to the ferroelectric capacitor on the side of the bit line BL0 is performed. At this time t8, the first timing sequence timing1 from time t0 ends.

When the active period becomes long, the state at time t9, that is, the suspending state in which PL=VDD level, WL=VDD+Vth, one of the bit lines xBL is at VDD level, and the other BL is at GND level, continues for a long time. In this lengthened suspending state, in an unselected cell for which the plate line PL=VDD level and the word line WL=GND level, the node nxx within the cell changes to the bit line BL=GND level due to leakage operation of the access gate, and because the plate line PL=VDD level and the node within the cell is nxx=GND level, a write voltage for data (0) is imparted to the ferroelectric capacitor, and stored data may be destroyed, which is a problem.

From the rising of the chip select signal /CS at time t10, the second timing sequence timing2 begins. First, after the plate line PL falls at time t11, in the period from time t12 when the plate line PL=GND level until the time t13 when the bit line xBL0 falls, the bit line is xBL0=VDD level, and so data (1) is written to the ferroelectric capacitor on the bit line xBL0 side.

Or, in the case not of delayed writing but of a read cycle, the write amplifier is not driven at time t8, and the bit line pair continues to be driven by the latch amplifier from time t5 until immediately before time t14. In such a suspending state also, there are cases in which erroneous writing of data (0) to half-selected cells occurs.

And, immediately before time t13, the control signal φwrite is returned to GND level, the BUS line and write amplifier output are separated, at time t13 the control signal φbusgnd is brought to VDD level, the data bus BUS, xBUS are precharged to GND level, and the bit line xBL0 which had been at VDD level goes to GND level. Further, at time t14 the word line WL falls, thereafter φsensex is switched to VDD level and φsense is switched to GND level, the latch amplifier is turned off, the column select control signal φCOL is turned off, and the second timing sequence timing2 ends.

In order to prevent the above-described destruction of data in half-selected cells in lengthy suspending states, in this embodiment both the bit lines and the plate line are all maintained at GND level in the suspending sate, as described below.

FIG. 5 is a detailed waveform diagram of the improved HiZ method delayed writing of (c) in FIG. 3. The main sense and write system signals of FIG. 2 and control signals for these have been added to (c) of FIG. 3. In FIG. 5, the signals of the nodes Do, xDo of the latch amplifier are the same as in FIG. 4. However, as explained in (c) of FIG. 3, the method of driving the bit line pair BL0, xBL0 is different.

In the precharge period preceding time t0 with the timing of the falling of the chip select signal /CS, the bit line pair is precharged to GND level.

In the active period beginning with the falling of the chip select signal /CS, at times t0 to t3 up in which the voltage of the selected bit line pair BL, xBL is captured by the nodes Do, xDo of the latch amplifier, is the same as in FIG. 4. At this time, the unselected bit line pairs are all at GND level in this embodiment.

Thereafter, at time t4 the control signal φread is lowered and the gates Trbus, xTrbus are turned off, and the data buses BUS, xBUS and latch amplifier nodes Do, xDo are separated. And when at time t5 the control signals are switched to φsensex=GND level and φsense=VDD level and the latch amplifier LA is activated, the nodes Do, xDo are latch amplified to VDD level and GND level. In the interval from times t4 to t6, because the gates Trbus, xTrbus are turned off, the nodes Do, xDo are separated from the data bus pair, so that the levels of the bit line pair and data bus pair are maintained.

And, at time t6 the control signal φbusgnd is brought to VDD level and the NMOSFETs Qbpd, xQbpd are turned on, the data buses BUS, xBUS are lowered to GND level, and the bit line pair BL0, xBL0 is brought to GND level as well. At this time the plate line is still PL=VDD level, so that data (0) is written to both of the ferroelectric capacitors of the selected cell by the bit line pair BL0, xBL0. This writing of data (0) to both the ferroelectric capacitors is performed regardless of the stored data in the selected cell and of Din data during write cycle. Then, at time t7* the plate line PL is lowered, the writing of data (0) between times t6 and t7* ends, and the first timing sequence timing1 ends.

And, in a long active period, in the interval from times t7* to t10, the readout data is retained by the latch amplifier LA, and a suspending state is entered with the plate line and bit line pair being at PL=BL0=xBL0=GND level.

The write data Din(DATA) is captured in the chip at the time of the rising of the chip select signal /CS or write enable signal /WE, whichever is earlier, at time t10, and the second timing sequence timing2 is started from the rising of the chip select signal /CS. At time t10 the control signal φbusgnd is at GND level and the data buses BUS, xBUS are put into the high-impedance state HiZ, after which, at time t11*, the word line WL is boosted to VDD+Vth or higher. And, from time t12°, with the control signal φwrite at VDD level, the write amplifier WA drives the data buses, and raises the bit line xBL0 (or depending on the write data, the bit line BL0) to VDD level. Immediately before time t13 the control signal φwrite is at GND level and driving of the data buses by the write amplifier is turned off. Then, at time t13 the control signal φbusgnd is again put to VDD level, the data bus pair is precharged to GND level, and by this means the bit line xBL0 (or BL0) is returned to GND level.

From t12* to t13, PL=GND level and xBL0=VDD level, so that data (1) is written to the ferroelectric capacitor on the bit line xBL0 side. From time t14 the word line WL is also returned to GND level, the control signals φsensex, φsense are transitioned, the latch amplifier LA is turned off, the column select control signal φCOL is turned off, and the second timing sequence timing2 ends.

In the case of a readout cycle rather than delayed writing, during driving of the data bus pair by the write amplifier from time t12°, the input selector SeIW of the write amplifier WA is switched to the side of the latch amplifier node Do rather than the input Din. By this means, based on the stored data which had been retained by the latch amplifier, the write amplifier drives the bit line pair from times t12° to t13, and rewriting of data (1) is performed (Restore). However, in FIG. 5 the latch amplifier is separated from the data buses, and so this operation differs from the case in which rewriting of the readout cycle is performed from the latch amplifier and driving of the data bus pair and bit line pair from the latch amplifier is used to perform the rewriting of FIG. 4.

In a delayed-write HiZ method write operation of this embodiment, in the case of a long active period, from times t7* to t10 a long suspending state is entered with the plate line and bit line pair at PL=BL0=xBL0=GND level. Hence in half-selected cells sharing the plate line with the selected cell, even when the access transistor threshold Vth is near 0 V, there is no potential difference between the plate line and the bit line pair, and erroneous writing to the ferroelectric capacitors of the cells can be prevented, so that there is no destruction of stored data.

This prevention of erroneous writing is possible not only in delayed write-type write operations, but also in readout operations. Further, prevention is similarly possible in read-modify-write operations when the write enable signal /WE falls during an active period after falling of the chip select signal /CS.

(Short Active Periods)

Next, the case of a short active period in the delayed write HiZ method is explained. In this embodiment, it was explained that the problem of destruction of stored data in a half-selected cell when the active period is long was solved; but when the active period is short, the active cycle can be made shorter.

Figure 6:
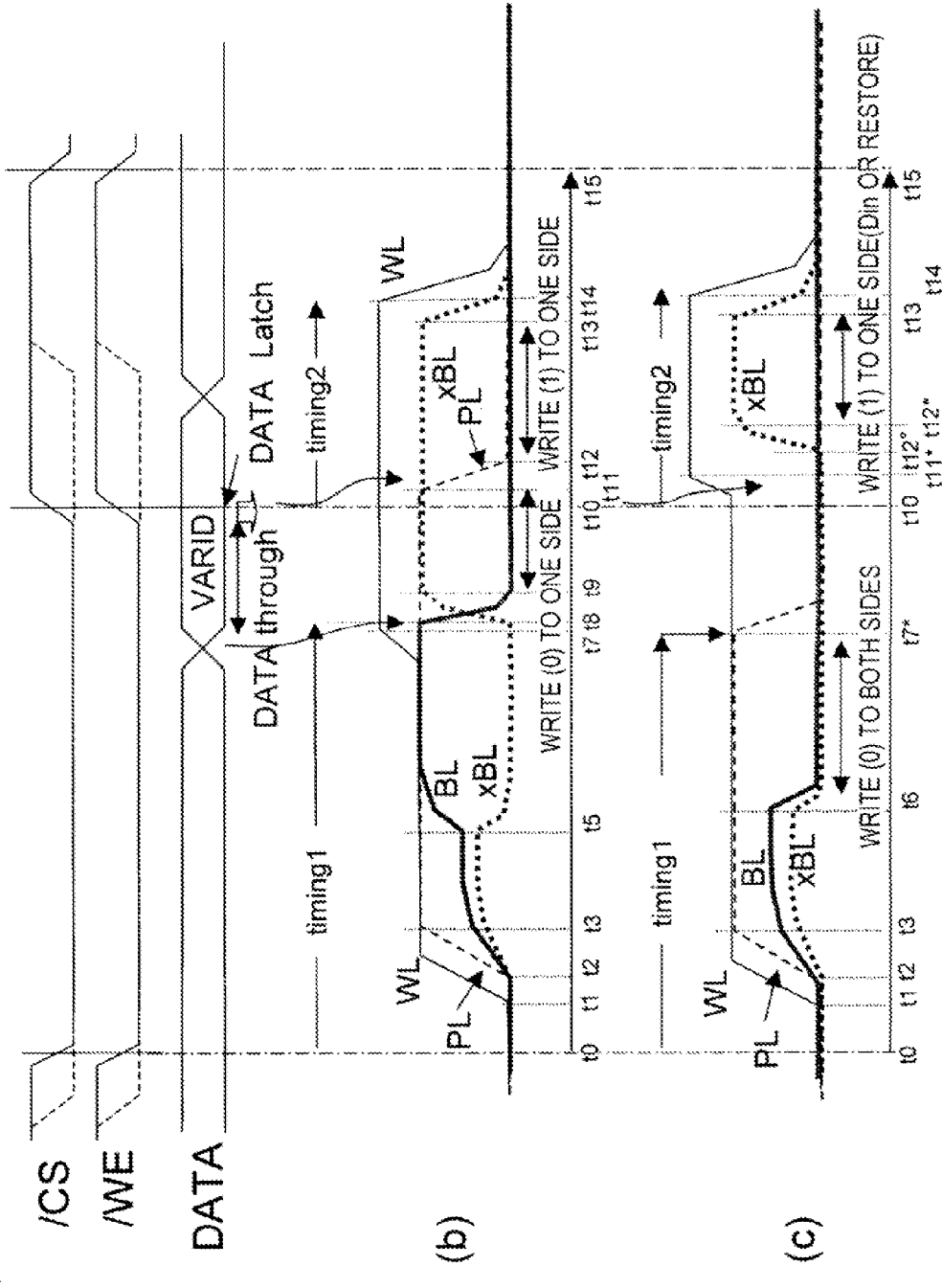
FIG. 6 is a waveform diagram for a case of a short active period in the delayed write HiZ method.

FIG. 6 is a waveform diagram for a case of a short active period in the delayed write HiZ method. In FIG. 6, similarly to FIG. 3, the driving waveforms outside the memory chip (a), and the driving waveforms for the word line WL, plate line PL, positive-logic bit line BL and the complementary negative-logic bit line xBL within the cell array (b), (c) are depicted. Here (b) in FIG. 6 is the problematic operation method, and (c) in FIG. 6 depicts the operation method of this embodiment.

In (b) and (c) of FIG. 6, WL, PL, BL and xBL depict the signals connected to the selected cell in the cell array. As the cell array configuration, the 2T2C design with PL parallel to BL of FIG. 1 is assumed. However, operation is similar for other cell array configurations as well. Further, in both (b) and (c) of FIG. 6, the first timing sequence timing1 and second timing sequence timing2 are the same as in (b) and (c) of FIG. 3.

In the problematic operation method of (b) in FIG. 6, data (1) is written to one of the ferroelectric capacitors with the falling of the plate line PL at time t11 in the second timing sequence, and so prior to this it is necessary to impart the external write data to the bit line pair and to secure a period t9-t10 for writing data (0) to the other ferroelectric capacitor. Hence at time t8 at the end of the first timing sequence, capture of the external write data Din is required to start, and moreover a comparatively long time for the data setup period is required to write data (0) in the period t9-t10, prior to the chip select signal /CS rising. This means that even when the active period is to be made short, the active period is made longer by the period t9-t10.

On the other hand, in this embodiment depicted in (c) of FIG. 6, prior to lowering the potential of the plate line PL at time t7* at the end of the first timing sequence, writing of data (0) to both ferroelectric capacitors is ended. Hence after capturing the external write data Din, without providing a data (0) write period, data (1) can be written in the period t12*-t13 in the second timing sequence. That is, the data setup time of (b) in FIG. 6 can be eliminated. Hence the active period can be made shorter in this embodiment (c) than (b).

Figure 7:
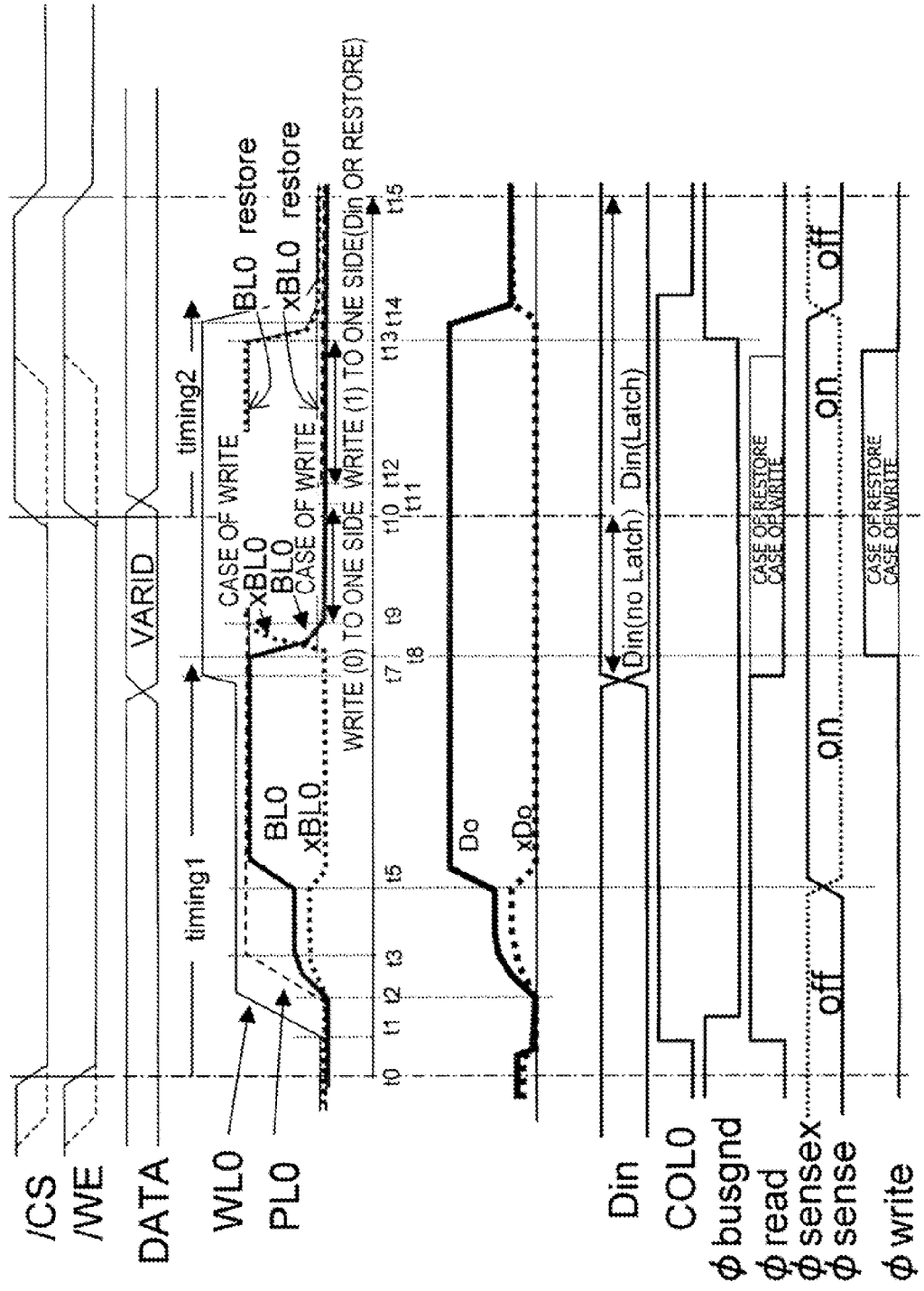
FIG. 7 is a detailed waveform diagram of a short cycle of the problematic HiZ method delayed writing of (b) in FIG. 6.

FIG. 7 is a detailed waveform diagram of a short cycle of the problematic HiZ method delayed writing of (b) in FIG. 6. The main sense and write system signals of FIG. 2 and control signals for these have been added to (b) of FIG. 6. Operation of the waveforms and driving signals from t0 to t15 are the same as for the HiZ method long cycle of FIG. 4, but the active period t0 to t10 has been shortened.

In FIG. 7, in the case of the readout cycle, from time t5 to t8 in which PL0=VDD level and xBL0=GND level, rewriting of data (0) is ended at time t8, so that in a restore (rewrite) operation in which the levels of the bit line pair BL0, xBL0 at time t8 are maintained at the time of rewriting data (1), the period t8 to t10 can be eliminated and the active period can be shortened.

However, in the case of the write cycle depicted in FIG. 7, the inversion data of the selected cell may be written, and so after transmitting the external write data Din into the chip at time t8, writing of data (0) finally begins after time t9. Hence it is necessary to secure for the period of writing data (0) between times t9 and t10 a certain length, generally 20 ns or longer, and to this extent the active period cannot be shortened.

Figure 8:
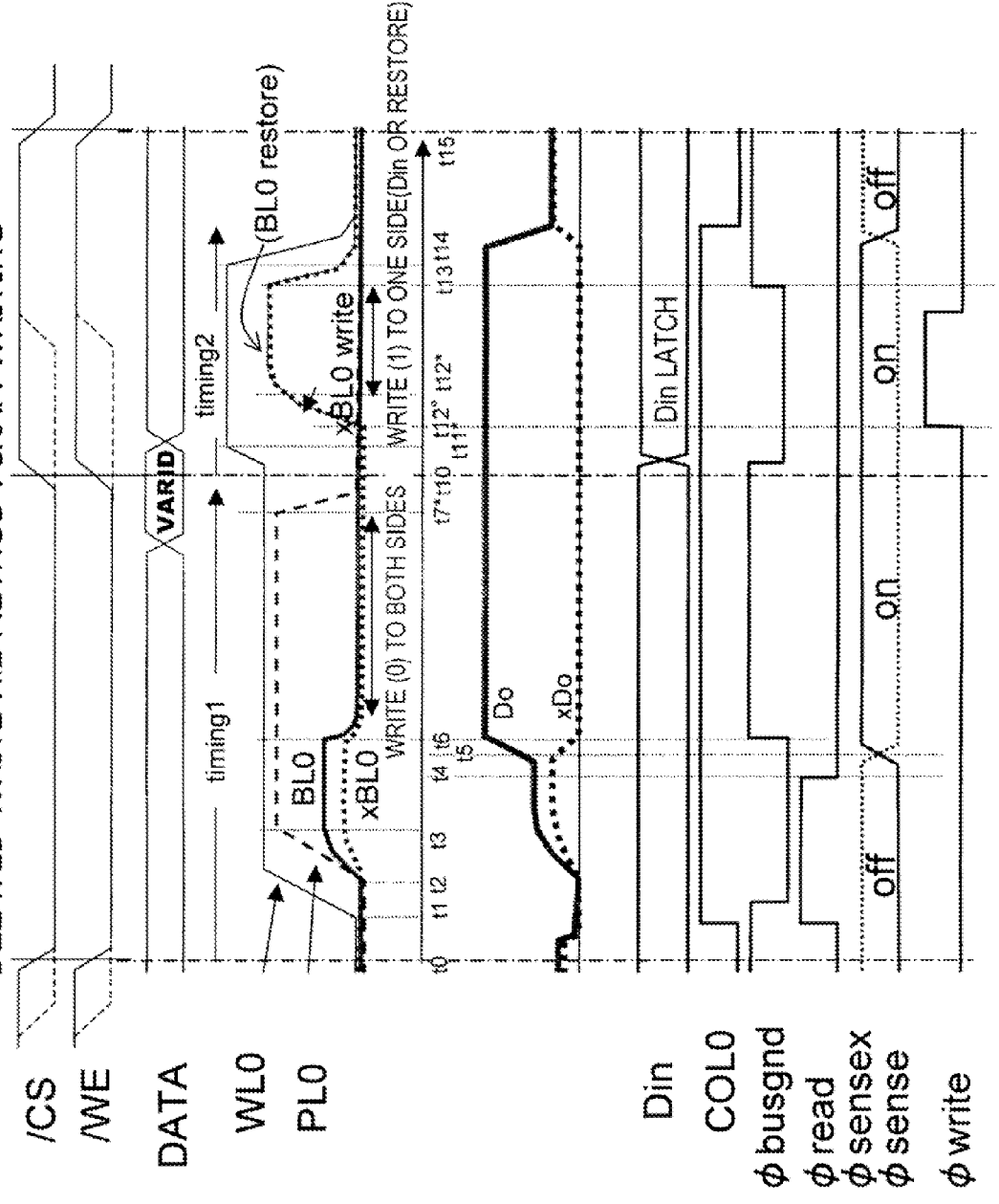
FIG. 8 is a detailed waveform diagram of a HiZ method delayed writing short cycle in the embodiment of (c) in FIG. 6.

FIG. 8 is a detailed waveform diagram of a HiZ method delayed writing short cycle in the embodiment of (c) in FIG. 6. The main sense and write system signals of FIG. 2 and control signals for these have been added to (c) of FIG. 6. The waveforms and driving signals from t0 to t10 are the same as for the improved HiZ method long cycle, but the active period t0 to t10 is shortened.

In FIG. 8, in the cases of both the readout cycle and the write cycle, between times t6 and t7* PL0=VDD level and BL0=xBL0=GND level, and rewriting or writing of data (0) to the ferroelectric capacitors on both sides is ended at time t7*. Hence the data (0) rewrite period from times t7* to t10 as depicted in FIG. 7 can be eliminated, and so the active period can be shortened.

As explained above, in the HiZ method delayed writing of this embodiment, the word line WL is driven, the plate line PL is driven, the charge on the ferroelectric capacitors in the selected cell is output to the bit line pair, and after the minute voltage difference of the bit line pair appears across the nodes Do, xDo in the latch amplifier LA, the bit line pair is separated from the latch amplifier nodes Do, xDo and is maintained at GND level, and according to the plate line potential PL=VDD level, data (0) is written to both the ferroelectric capacitors. Writing of data (0) to both ferroelectric capacitors is performed regardless of the stored data in the selected cell or Din data during write cycle. Thereafter the plate line PL is returned to GND level, and after a lengthy suspending state, the external write data Din is latched and data (1) is written to the ferroelectric capacitor corresponding to the bit line at H level.

Hence when the active period is long, in a long suspending state before the second timing sequence, the bit pair lines and plate lines of all cells are maintained at GND level, so that erroneous writing in unselected cells does not occur and there is no destruction of stored data. Further, immediately before the second timing sequence timing2, there is no need to write data (0) to one of the ferroelectric capacitors in the selected cell corresponding to the write data Din, so that the active period can be shortened.

In the above explanation of operation of the HiZ method, an example was explained in which the word lines WL are in the row direction and the bit line pairs BL, xBL and plate lines PL are disposed in the column direction as in FIG. 1, the latch amplifier LA is shared, and unselected bit lines are at GND level. However, this embodiment is not limited to such a disposition. Another disposition example is described below. Further, the explanation assumed that memory cells are of the 2T2C type, but as explained below, application to the 1T1C type is also possible.

(Second Embodiment BGS Method)

The second embodiment is an example applied to the BGS method, which is described in S. Kawashima et al, "Bitline GND sensing technique for low-voltage operation FeRAM", IEEE J. SC, Vol. 37, No. 5, pp. 592-598, May 2002. That is, when a word line is driven and a plate line is driven, bit line pairs are maintained at GND level, the charge output from a bit line pair is stored in a capacitor called a Ctank, and a change in the potential of the electrodes of this capacitor is latched and amplified by a latch amplifier.

In the second embodiment, the memory cell array configuration is the same as in FIG. 1.

Figure 9:
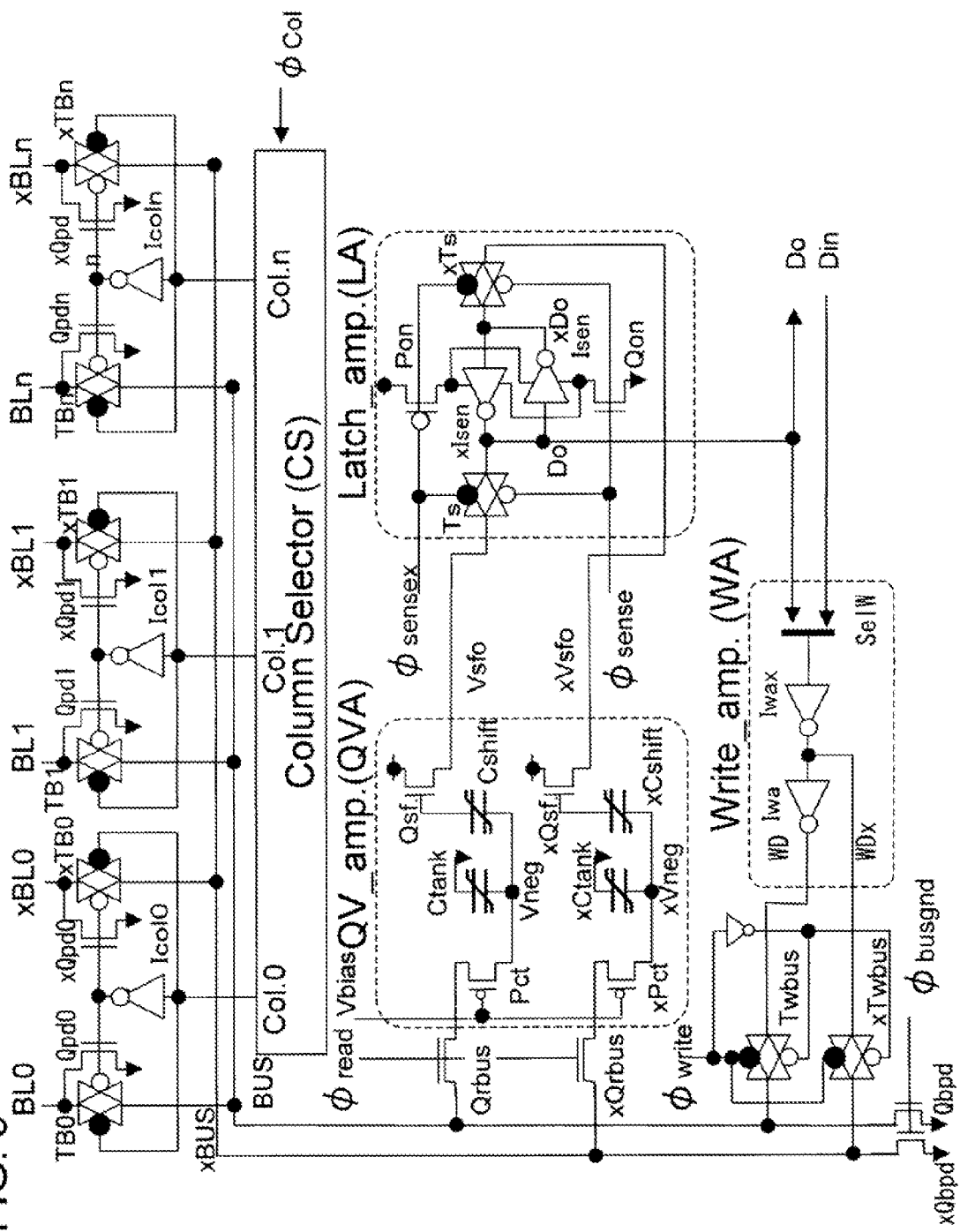
FIG. 9 depicts the configuration of the BGS method FeRAM column transfer gates, column selector, and data bus, and the latch amplifier and write amplifier connected thereto, of the second embodiment.

FIG. 9 depicts the configuration of the BGS method FeRAM column transfer gates, column selector, and data bus, and the latch amplifier and write amplifier connected thereto, of the second embodiment.

The bit line pairs BL0 to BLn, xBL0 to xBLn are connected to the bit line pairs in the cell array of FIG. 1. In a selected column, through the column select signal COL.0=H level set by the column selector CS, the bilateral gates TB0 and xTB0, comprising PMOSFET and NMOSFET parallel transfer gates, are turned on, and the bit line pair BL0, xBL0 and data bus pair BUS, xBUS are connected. Further, the bit line ground precharge NMOSFETs Qpd0, xQpd0 are turned off in the selected column. However, in order to precharge the bit line pairs in the selected column to GND level, NMOSFETs Qbpd, xQbpd which are turned on or off by a control signal φbusgnd are provided on the data bus pair BUS, xBUS.

On the other hand, in unselected columns, the transfer gates TB1 to TBn and xTB1 to xTBn are turned off, so that the unselected bit line pairs BL, xBL are separated from the data bus pair BUS, xBUS. And, the bit line ground precharge NMOSFETs Qpd, xQpd are turned on in unselected columns, so that all bit line pairs in unselected columns are fixed at GND level.

The data bus pair BUS, xBUS is connected to a charge/voltage conversion amplifier (QV) amplifier QVA via NMOSFETs Qrbus, xQrbus controlled by the control signal φread. This QV amplifier fixes the input at GND level by means of charge transfer amplifiers Pct, xPct, which are PMOSFETs. And, the QV amplifier suppresses rises in the input potentials of the bit line pair and data bus pair, absorbing only the charge therefrom in later-stage capacitance tanks Ctank, xCtank, and generating negative voltages Vneg, xVneg by means of the negative charge accumulated on the electrodes thereof. That is, charge is converted into voltages. Due to the influx of this charge, the negative voltages Vneg, xVneg on the electrodes rise. These negative voltages Vneg, xVneg are level-shifted to a level between GND-VDD by a level-shifting circuit comprising capacitors Cshift, xCshift and source-follower NMOSes Qsf, xQsf, and are input to the latch amplifier LA as signals with positive voltages Vsfo, xVsfo.

The latch amplifier LA is switched on or off by the control signals φsensex, φsense. When the latch amplifier LA is turned off, the bilateral gates Ts, xTs conduct, and input is captured. That is, in the state with the control signals at φsensex=VDD level, φsense=GND level, the upper and lower nodes of xIsen and Isen a CMOS inverter-cross-coupler are respectively separated from the power supply voltage VDD and ground GND by a PMOSFET Pon and NMOSFET Qon, the bilateral gates Ts, xTs are turned on, and the input voltage levels Vsfo, xVsfo are captured.

On the other hand, when the control signals are switched to φsensex=GND level and φsense=VDD level, by turning off the bilateral gates Ts, xTs and turning on the PMOSFET Pon and NMOSFET Qon, the signals of the nodes Do, xDo are amplified to the power supply voltage VDD and ground GND levels. And, the normal output is extracted from the node Do, and during readout is transmitted to the memory chip output Do, and is retained as data used in rewriting to the selected memory cell. During rewriting, the data bus pair and bit line pair are driven by the write amplifier WA according to this retained data.

The write amplifier WA has an input selector SeIW; during rewriting the output Do of the latch amplifier LA is selected, and during a write cycle the external input Din is selected. By means of the control signal φwrite, the normal output WD is connected by the bilateral gate Twbus to the data bus BUS, and the complementary output WDx is connected to the other data bus xBUS by the bilateral gate xTwbus.

Because in the on state the potential passed is substantially at GND level, the gates Qrbus and xQrbus are only NMOSFET transfer gates, but the other transfer gates pass all potentials from VDD to GND, and so are configured as bilateral gates in which PMOSFETs and NMOSFETs are connected in parallel.

(BGS Method Synchronous Writing)

Figure 10:
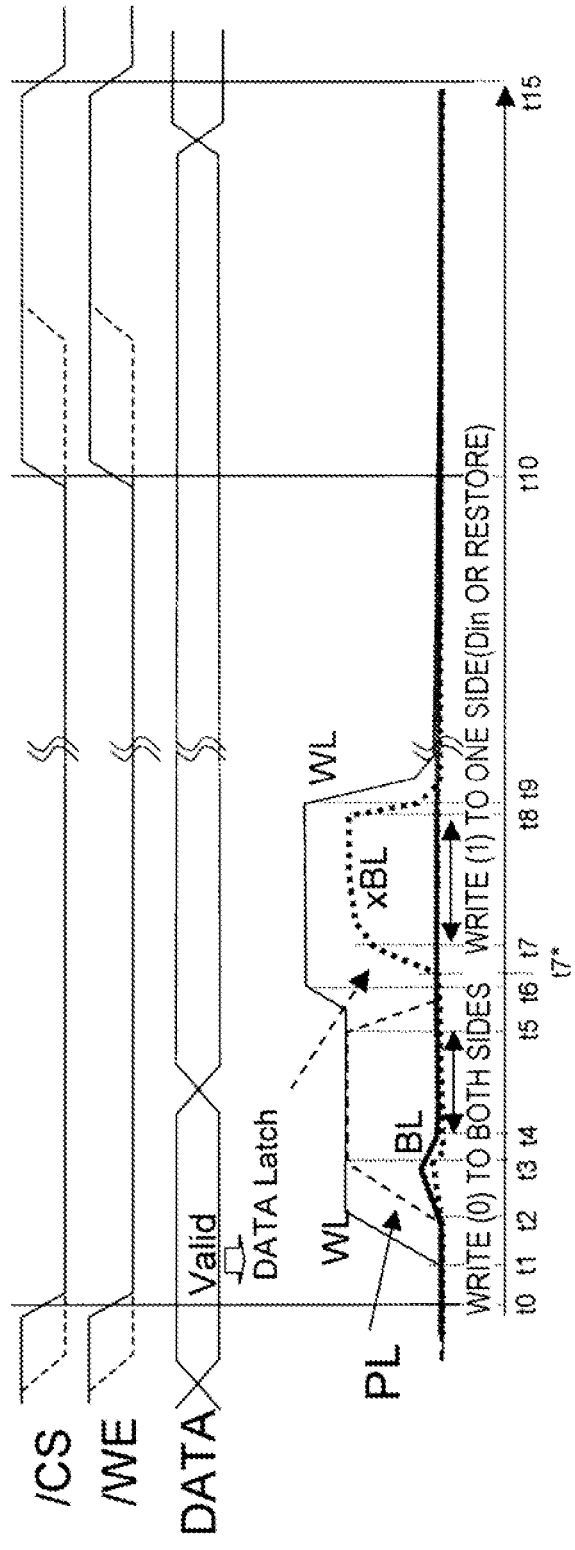
FIG. 10 is a waveform diagram of a synchronous write operation for BGS method FeRAM.

FIG. 10 is a waveform diagram of a synchronous write operation for BGS method FeRAM. In synchronous writing, the address is captured with the falling of the chip select signal /CS, and the write data is captured and written to the memory cell with the falling of the write enable signal /WE. FIG. 10 depicts the /CS, /WE and DATA signals from outside the memory chip, as well as the driving waveforms for the word lines WL, plate lines PL and the positive logic bit lines BL and complementary negative logic bit lines xBL of the internal cell array. In the figure, signals are depicted for the WL, PL, BL and xBL connected to the selected cell.

In FIG. 10, the memory chip active period begins from the time t0 of the falling of the chip select signal /CS. And at time t1 the potential of the word ine WL rises, and when the potential of the plate line PL rises from times t2 to t3, charge from the ferroelectric capacitors of the selected cell flow out to the bit line pair. When the stored data was (0) up until time t2, a small amount of charge equivalent to the linear capacitance flows out to the bit lines, and when the stored data was (1) up until time t2, a large amount of charge, equal to the linear capacitance+polarization reversal charge (1→0 reversal), flows out to the bit lines. In FIG. 10, a large amount of charge is flowing out on the side of the bit line BL. However, because in the BGS method the bit lines are maintained at ground level, the potentials of the bit lines BL, xBL rise hardly at all from GND level, and when rising of the potential of the plate line PL halts at time t3, at time t4 the bit line pair returns to GND level.

And, in the period between times t4 and t5, the plate line PL is at VDD level and both bit lines BL, xBL are at GND level, so that data (0) is written to both the ferroelectric capacitors in the cell. And, at time t5 the plate line PL is lowered to GND level to prepare for writing the next data (1). Thereafter, at time t6 the potential of the word line WL is raised to the Vth of the NMOSFET or higher, and from time t7*, when the bit line xBL corresponding to the latched write data is raised to VDD level, the node in the cell is also raised to VDD level through the NMOSFET access gate in the on state. The plate line PL is at GND level, and so the full potential of VDD level is applied to the ferroelectric capacitor, and data (1) is written. Thus from t7 to t8 is the data (1) write period.

In the readout cycle, the write amplifier WA drives the bit line BL or xBL according to the data retained by the latch amplifier LA, and in the write cycle, drives the bit line BL or xBL according to the input data Din from outside.

Thereafter, from time t8 the bit line xBL is returned to GND level, from time t9 the word line WL is returned to GND level, and the write sequence from t0 ends. When the active period is long, the operation end state in the memory chip continues. And, from time t10 with the timing of the rising of the chip select signal /CS or write enable signal /WE, whichever is earlier, the precharge state is entered, and from time t15 the next cycle (active period) begins.

(BGS Method Delayed Writing in the Second Embodiment)

Figure 11:
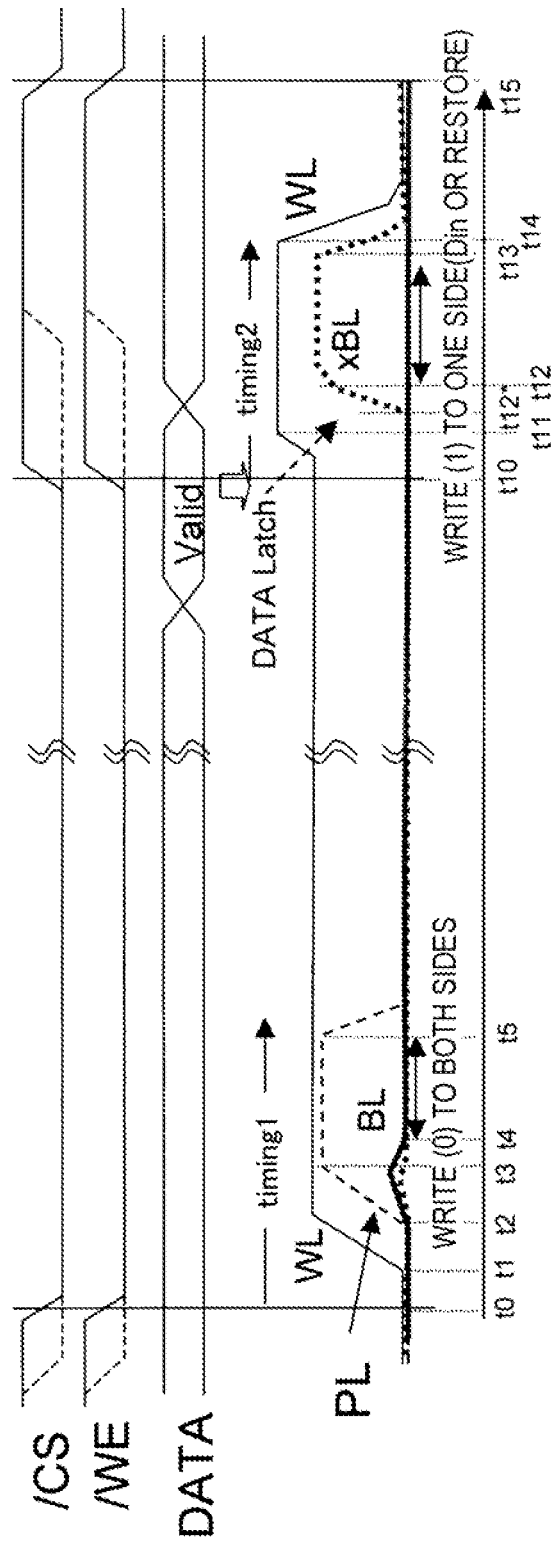
FIG. 11 is a waveform diagram of BGS method delayed writing in the second embodiment.

FIG. 11 is a waveform diagram of BGS method delayed writing in the second embodiment. Similarly to FIG. 10, signals from outside the memory chip, and the WL, PL, BL, and xBL of the selected cell are depicted. In the delayed write method, as explained above, the address is captured with the falling of the chip select signal /CS, the active period begins, and internal cell selection operation is performed. Further, the write data is captured with the rising of the chip select signal /CS or write enable signal /WE, whichever is earlier, the active period ends with the rising of the chip select signal /CS, and writing to the selected cell is performed during the subsequent precharge period.

First, from times t0 to t5, the first timing sequence timing1 begins from the falling of the chip select signal /CS. That is, the word line WL is driven, the plate line PL is driven, charge from the selected cell flows out to the bit line pair, the charge is absorbed by the QV amplifier, and the bit line pair is maintained at GND level. Hence at times t4-45, data (0) is written to both the ferroelectric capacitors of the selected cell.

After time t5, if a state in which the plate line PL is maintained at VDD level is maintained, if the active period is long, if in an unselected cell sharing the same plate line PL the access gate threshold is near 0 V, leakage current may cause a node in the cell to fall to GND level, and due to the VDD level of the plate line PL, data (0) may be erroneously written. This is destruction of stored data, and is an unwanted operation.

Hence in the second embodiment, in the BGS method also, at time t5 the plate line PL is lowered to GND level, and thereafter until time t10 a suspending period is maintained in a state with WL=VDD and PL=BL=xBL=GND level. By this means, the selected bit line pair and unselected bit line pairs are also at GND level, and the selected plate line PL is also at GND level, so that erroneous writing does not occur even when the threshold voltages of access gates are low in the selected cell, in half-selected cells, and in unselected cells.

Next, at time t10 with the timing of the rising of the chip select signal /CS the active period ends, and the write data Din is captured with the rising of the chip select signal /CS or write enable signal /WE, whichever is earlier. And from time t10 the second timing sequence timing2 starts. At time t11 the potential of the word line WL is raised from VDD level by Vth or more, and from time t12* the write amplifier WA is started, and the potential of one of the bit lines xBL (or BL) corresponding to the write data Din in write cycle or the latched stored data Do in read cycle is raised to VDD level. Hence from times t12 to t13 the bit line xBL=VDD level and PL=GND level, so that writing of data (1) to the selected cell is performed. Thereafter, from time t13 the bit line xBL (or BL) is returned to GND level, from time t14 the word line WL is also returned to GND level, and the second timing sequence ends.

As another viewpoint, in the synchronous method of FIG. 10, both cell data sensing and writing to the cell are performed during the active period, and in the delayed write method of FIG. 11, cell data sensing is performed in the active period, and writing to the cell is performed in the precharge period after the end of the active period. Hence in both cases the minimum cycle time is the active period +precharge period, but in the synchronous method the precharge period can be shortened, and in the delayed write method the active period=precharge period, and driving can be performed by a chip select signal /CS waveform with a duty ratio near 50%.

These operation examples were explained for 2T2C FeRAM cells in which a memory cell comprises two access gates and two ferroelectric capacitors; but the BGS method delayed writing operation divided into the first and second timing sequences of FIG. 11 can also be applied to a 1T1C FeRAM cell configuration comprising one access gate and one ferroelectric capacitor.

When memory cells are the 1T1C type, the difference in charge amounts flowing out to the bit line BL connected to the memory cell and to the dummy bit line xBL each is detected by a QV amplifier and latch amplifier similarly to the above, and rewriting or writing is performed by a write amplifier WA. In this case also, in a first timing sequence timing1, the bit line BL and dummy bit line xBL are both maintained at GND level, so that the word line and plate line are driven and while the bit line BL is at GND level data (0) is written. This writing of data (0) is performed regardless of the stored data in the selected cell and the write data. Thereafter, the plate line PL is lowered to GND level and the suspending state is continued. Erroneous writing to half-selected cells during suspending is avoided. And, in the second timing sequence timing2, the bit line BL is driven and data (1) is written according to the write data or restore data.

Figure 12:
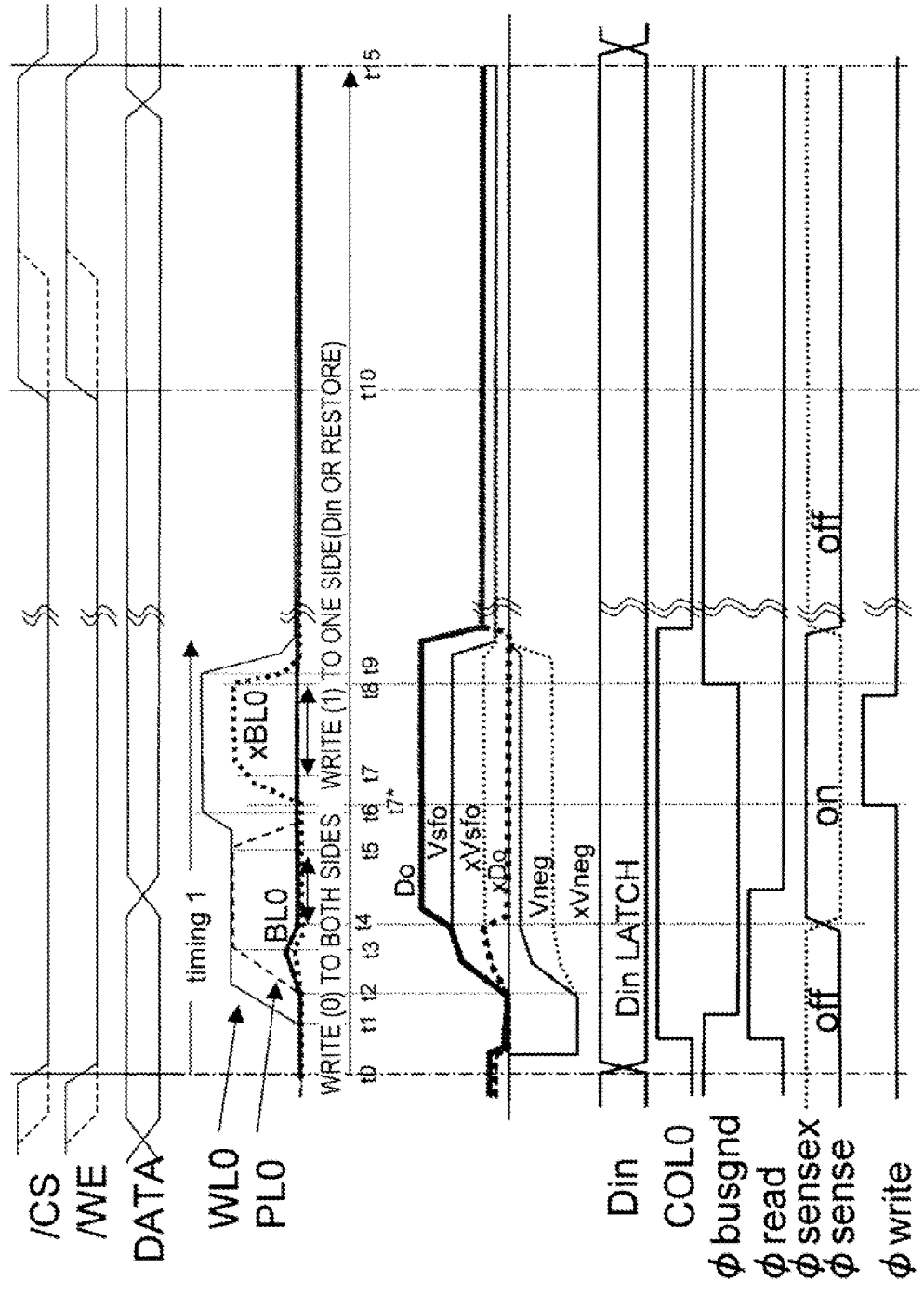
FIG. 12 is a detailed waveform diagram of BGS method synchronous writing.

FIG. 12 is a detailed waveform diagram of BGS method synchronous writing. The main sense and write system signals of FIG. 9 and control signals for these have been added to the waveform diagram of FIG. 11.

Focusing on the signal level of the QV amplifier, first a precharge voltage is imparted to the bit line pair by time t2, and the bit line pair is connected to the data bus pair by the control signal COL0 and to QVA by the control signal φread. Between times t2 and t3, during rising of the potential on the plate line PL, charge from the selected cell passes through the bit line pair and data bus pair and is absorbed by the capacitance tank Ctank, and the potentials Vneg, xVneg of the electrodes thereof rise. The bit line pair potentials also rise to some degree, but by time t4 all of the charge is absorbed by the capacitance tank Ctank, and the levels return to GND level. The potentials Vfso, xVfso resulting from level shifting of the potentials Vneg, xVneg also rise, the charge amount generated by the cell is converted to a voltage, and this is transmitted to the nodes Do, xDo of the latch amplifier LA.

At time t4 when the control signals are switched to φsensex=GND level and φsense=VDD level, the nodes Do, xDo within the latch amplifier are latch amplified to VDD level and GND level. Then the control signal φread is brought to GND level and the data bus pair is separated from the QV amplifier. Between times t4 and t5, data (0) is written to both ferroelectric capacitors, as described below.

And, in order to write data (1), at time t7* the control signal φwrite causes the write amplifier WA to drive the data bus xBUS and bit line xBL0 to VDD level. After the control signal φwrite causes the write amplifier to disconnect the connection of the data bus pair, from time t8 the bit line xBL0 is returned to GND level, and the control signal φbusgnd directly precharges the data bus pair to GND level. Then the signals of the column select circuit COL0 and QV amplifier, the control signals φsensex and φsense, and similar are returned to the initial state, and the first timing sequence ends.

Figure 13:
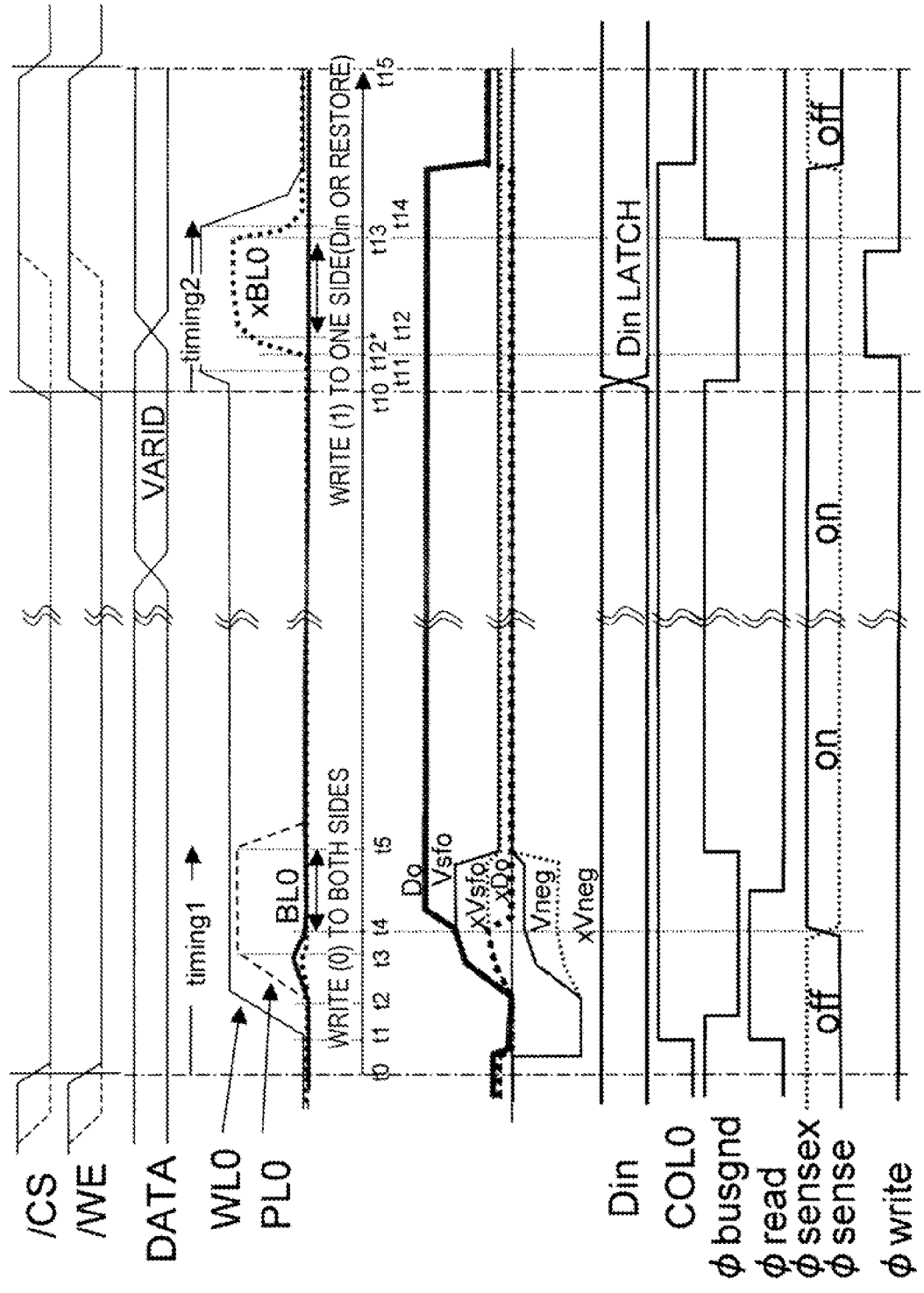
FIG. 13 is a detailed waveform diagram of BGS method delayed writing in this embodiment.

FIG. 13 is a detailed waveform diagram of BGS method delayed writing in this embodiment. The main sense and write system signals of FIG. 9 and control signals for these have been added to the waveform diagram of FIG. 11.

From times t0 to t4, from driving of the word line until amplification by the latch amplifier, operation is the same as the synchronous operation of FIG. 12. In this interval, the control signal φread is at VDD level, and the data bus pair is held at GND level during the period in which the QV amplifier is connected. Then, after the control signal φread goes to GND level, near time t5 the control signal φbusgnd is transitioned to VDD level, and by this means the data bus pair is held at GND level. Unselected bit line pairs are all fixed at GND level.

Between times t4 and t5, the plate line PL is at VDD level and the bit line pair BL, xBL is at GND level, so that data (0) is written to both ferroelectric capacitors in the selected cell. This data (0) writing is performed regardless of the stored data in the selected cell and the write data for the selected cell.

And, in the first timing sequence timing1, QV amplifier initialization is performed, and in the suspending state during the active period the latch amplifier LA is active and readout data is held at the nodes Do, xDo, and the column select signal COL0 is also held on. During this suspending, erroneous writing to half-selected cells will not occur because PL=BL=xBL=GND and even if WL access gate leaked no potential difference will be implied to the ferroelectric capacitors.

At time t10, when the chip select signal /CS rises, the second timing sequence timing2 is started and writing begins. Further, write data Din is captured with the rising of the chip select signal /CS or write enable signal /WE, whichever is earlier. The control signal φbusgnd is brought to GND level and the data buses are put into a high impedance state (HiZ), at time t11 the word line WL is raised from the VDD level by Vth or more, from time t12* the control signal φwrite is brought to VDD level and the data buses are driven by the write amplifier WA, and the potential of the bit line xBL0 (or, depending on DATA, BL0) is raised to VDD level.

Then, the control signal φwrite is brought to GND level and driving of the data bus pair by the write amplifier is turned off, after which at time t13 the control signal φbusgnd is again brought to VDD level and a data bus precharged to GND level to return the bit line xBL0 (or BL0) to GND level. From time t14 the word line WL is also returned to GND level, the control signals φsensex and φsense are transitioned and the latch amplifier LA turned off, the column select signal COL0 is turned off, and the second timing sequence ends.

In a write operation by the delayed writing BGS method, in the first timing sequence timing1 after the address is captured, the bit line pair is maintained at GND level, and by driving the plate line PL0 to VDD level data (0) is written to both ferroelectric capacitors in the selected cell. And, thereafter the plate line PL0 is lowered to GND level and suspending continues until the second timing sequence timing2. During this suspending, the bit line pairs BL0, xBL0 and the plate line PL0 are all maintained at GND level, so that the problem of erroneous writing in half-selected cells does not occur. And, in the second timing sequence timing2 after the write data has been captured, only one of the bit lines is driven to VDD level by the write amplifier, and data (1) is written to one of the ferroelectric capacitors in the selected cell.

The above operation is similar for asynchronous readout operation as well as for delayed writing type write operations. That is, when the chip select signal /CS falls and the active period begins, the data of the cell selected according to the input address is read out, and data (0) is rewritten to both the ferroelectric capacitors. Thereafter the chip select signal /CS rises, and in the suspending period until the precharge period begins, the bit line pair and plate line are held at BL=xBL=PL=GND, and erroneous writing in half-selected cells is avoided. And, in the precharge period one of the bit lines is driven to VDD by the write amplifier, and rewriting of data (1) is performed.

(Modified Example of Memory Cell Array)

In the explanation of operation of the HiZ method in the first embodiment, an example was explained in which the word lines WL of FIG. 1 were disposed in row directions and the bit line pairs BL, xBL and plate lines PL were disposed in column directions, a latch amplifier LA was shared, and unselected bit lines were held at GND level. However, HiZ method embodiments are not limited to such arrangements. Below, another arrangement example is explained.

Figure 14:
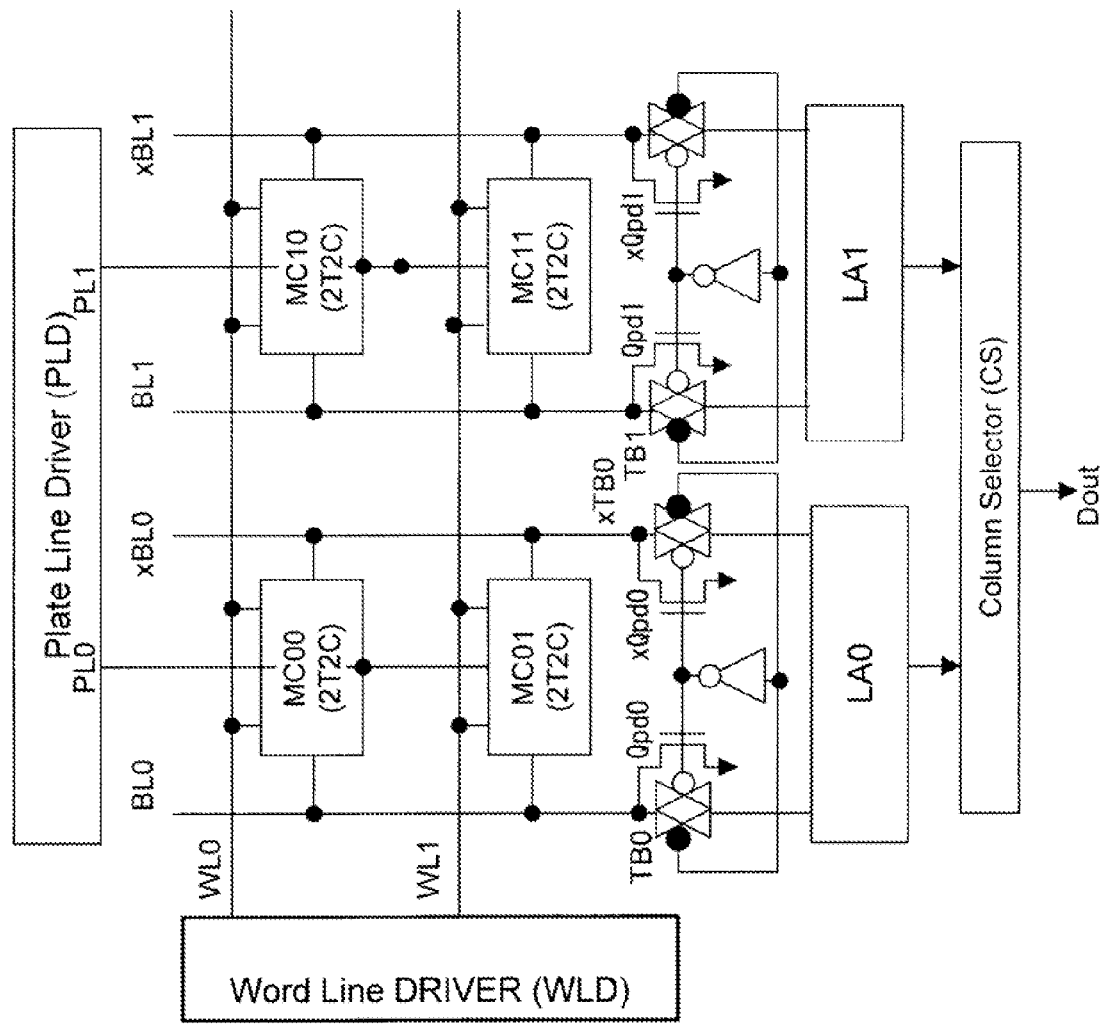
FIG. 14 depicts another example of a memory cell array of this embodiment.

FIG. 14 depicts another example of a memory cell array of this embodiment. In this example, word lines WL are disposed in the row direction, and bit line pairs BL, xBL and plate lines PL are disposed in the column direction; a latch amplifier LA is provided for each bit line pair. And, transfer gates TB, xTB are provided between bit line pairs BL, xBL and latch amplifiers LA. Further, similarly to FIG. 2, MOSFETs Qpd, xQpd which bring unselected bit line pairs to ground level (GND level) are provided for each bit line pair.

In this example, when a word line and a plate line are driven, the transfer gates TB, xTB are turned on, the selected bit line pair is connected to the latch amplifier LA, and thereafter the transfer gates are turned off and the latch amplifier separated, and the selected bit line pair is brought to GND level. The latch amplifier of the selected bit line pair is activated, and senses and amplifies the data. The transfer gates of unselected bit line pairs are turned off so that the bit line pairs are at GND level, and the latch amplifiers remain inactivated.

In this example also, when the word line WL0 is driven, the plate line PL0 is driven, and the memory cell MC00 is selected, if the threshold voltages of access transistors of a half-selected cell MC01 sharing the plate line PL0 is low, erroneous writing occurs. By means of this embodiment, such erroneous writing is prevented.

Figure 15:
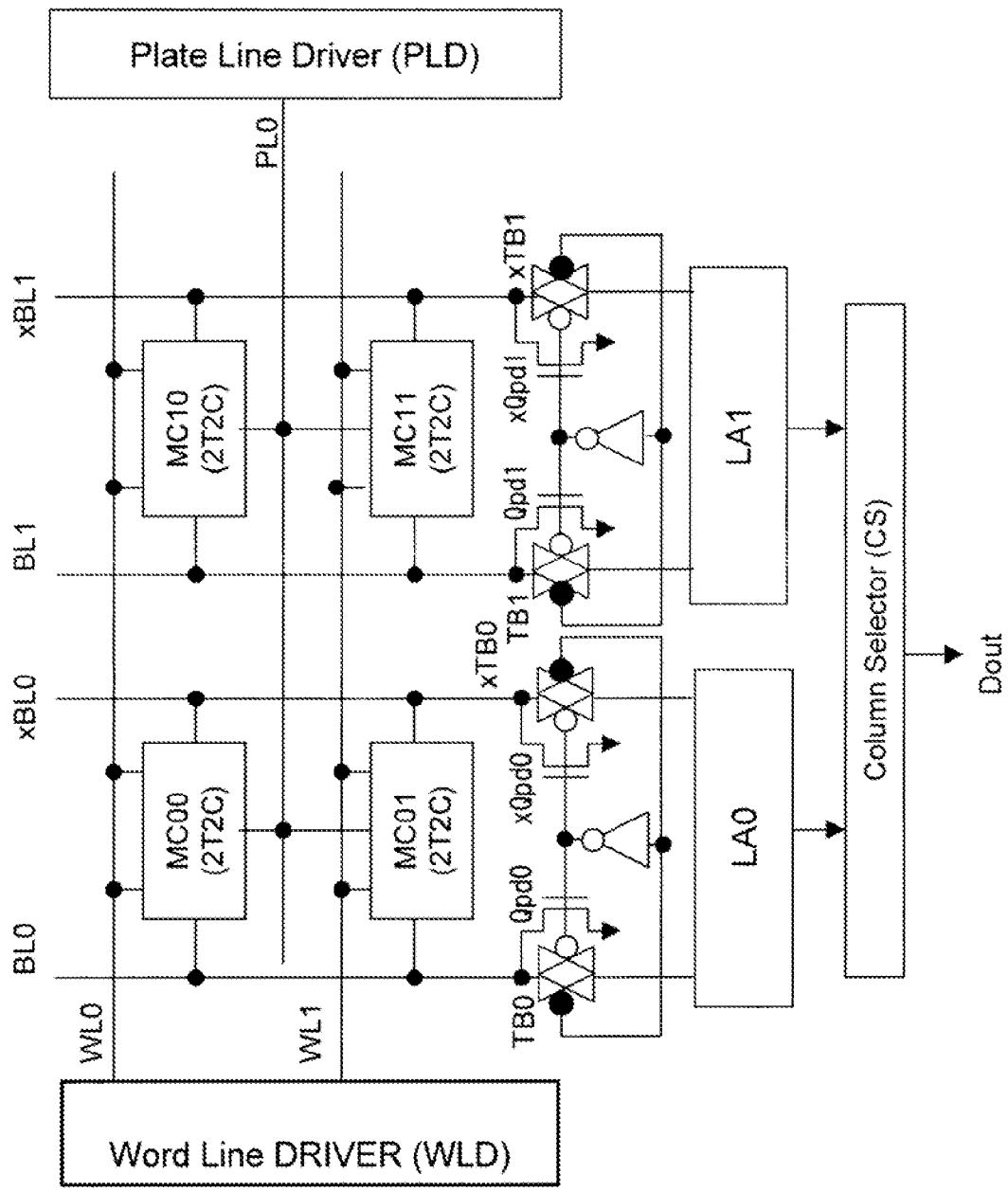
FIG. 15 depicts another example of a memory cell array of this embodiment.

FIG. 15 depicts another example of a memory cell array of this embodiment. This is an example in which the plate lines PL of FIG. 9 are disposed in the row direction. However, plate lines PL are shared by two rows of memory cells MC00, MC01. In this case, latch amplifiers LA0 and LA1 are simultaneously driven. When the word line WL0 is driven and the plate line PL0 is driven to select the memory cells MC00 and MC10, if the access transistors of the half-selected cells MC01 and MC11 sharing the plate line PL0 have low threshold voltages, erroneous writing occurs. By means of this embodiment, such erroneous writing is prevented.

In FIG. 15, in a case in which plate lines PL are provided for each row, it is necessary to connect all bit line pairs to latch amplifiers and enable rewriting even in the half-selected cell MC10 selected by the word line WL0. In this case also, by separating the bit line pair from the latch amplifier and bringing it to GND level, bringing the plate line to GND level also, writing data (0) to both ferroelectric capacitors, and then again connecting the latch amplifier to the bit line pair and driving the bit line pair, data (1) can be written to one of the ferroelectric capacitors. In this case, there is no longer a need to write data (0) immediately before the second timing sequence, and the active cycle can be shortened.

Figure 16:
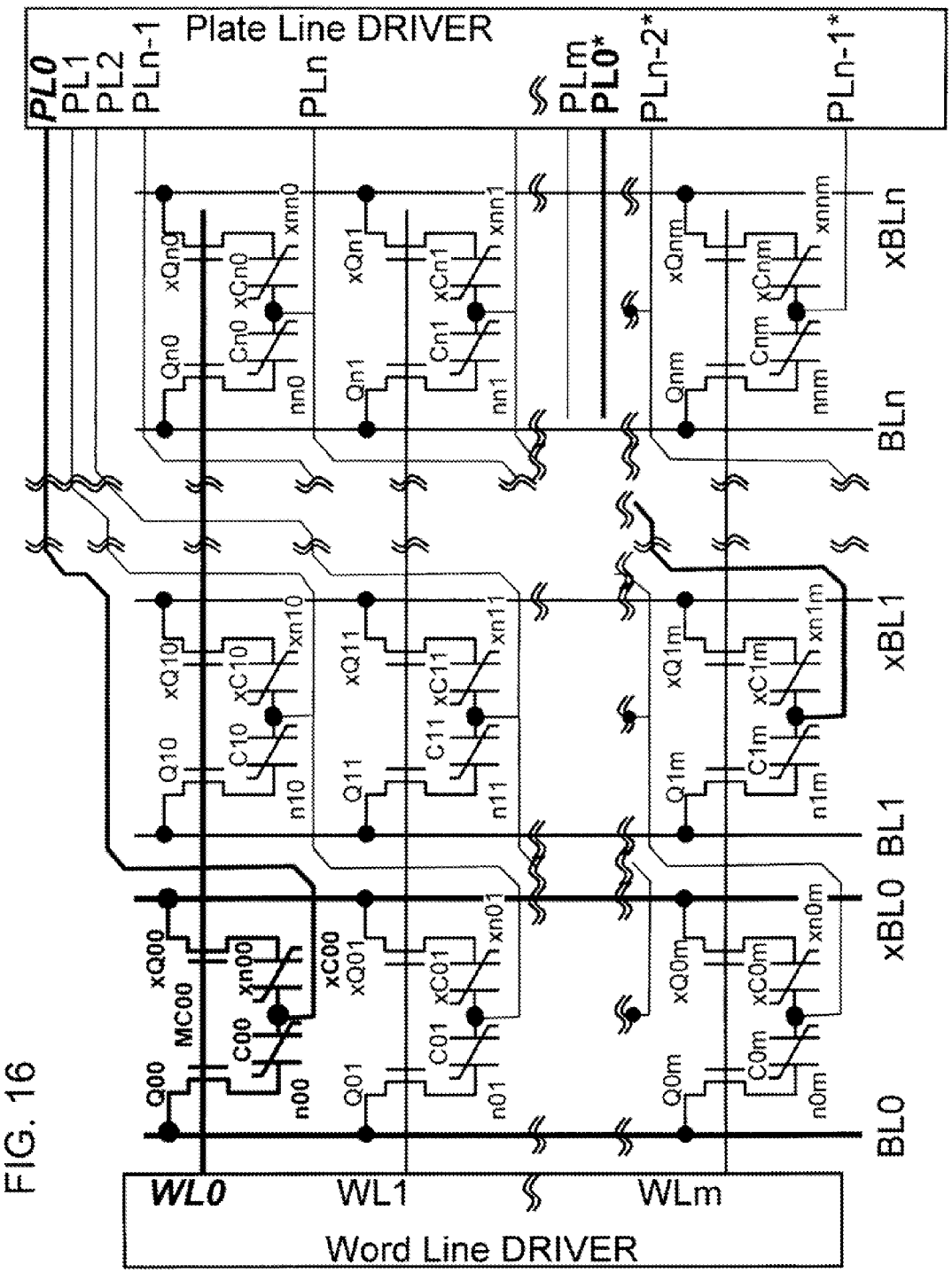
FIG. 16 depicts another example of a memory cell array of this embodiment.

FIG. 16 depicts another example of a memory cell array of this embodiment. This is an example of stair-type plate lines, in which the plate lines PL of FIG. 4 are disposed in the row direction, but plate lines PL are shifted upward one row at each column. Such stair-type plate lines are for example described in Japanese Patent Laid-open No. 2001-358312 and similar. In this case, when a word line WL0 is driven and a plate line PL0 and PL0* are driven to select a memory cell MC00, if the threshold voltage of the access transistors of a half-selected cell sharing the plate line PL0* is low, erroneous writing occurs. By means of this embodiment, such erroneous writing is prevented.

With the stair-type plate lines PL of FIG. 16, the memory cell MC00 is selected using the word line WL0 and plate line PL0. Unselected BLs are held at GND level, so that if a PL and WL are not selected simultaneously, the polarization direction of capacitors in half-selected memory cells can be maintained, and data is not destroyed. In this case, the plate line group PL0 to PLn-1 include simple wires or dummy cells from the plate line driver positioned on the right to cells requiring the plate line connection. On the other hand, the plate line group PLn to PLm are connected to n memory cells in the row of the word line WL one row below for each different bit line BL in the horizontal direction. The plate line group PL0* to PLn-1* are connected to memory cells the rows of word lines WL one row below for each different bit line BL from the memory cells nearest the plate line drivers to the memory cells of word line WLm, and drive a number of memory cells smaller than n. In plate line driver operation, PL0 and PL0*, PL1 and PL1*, , , PLn-1 and PLn-1*, are both driven simultaneously. The sum of the memory cells connected to both plate line groups is n. It is assumed that m>n.

Figure 17:
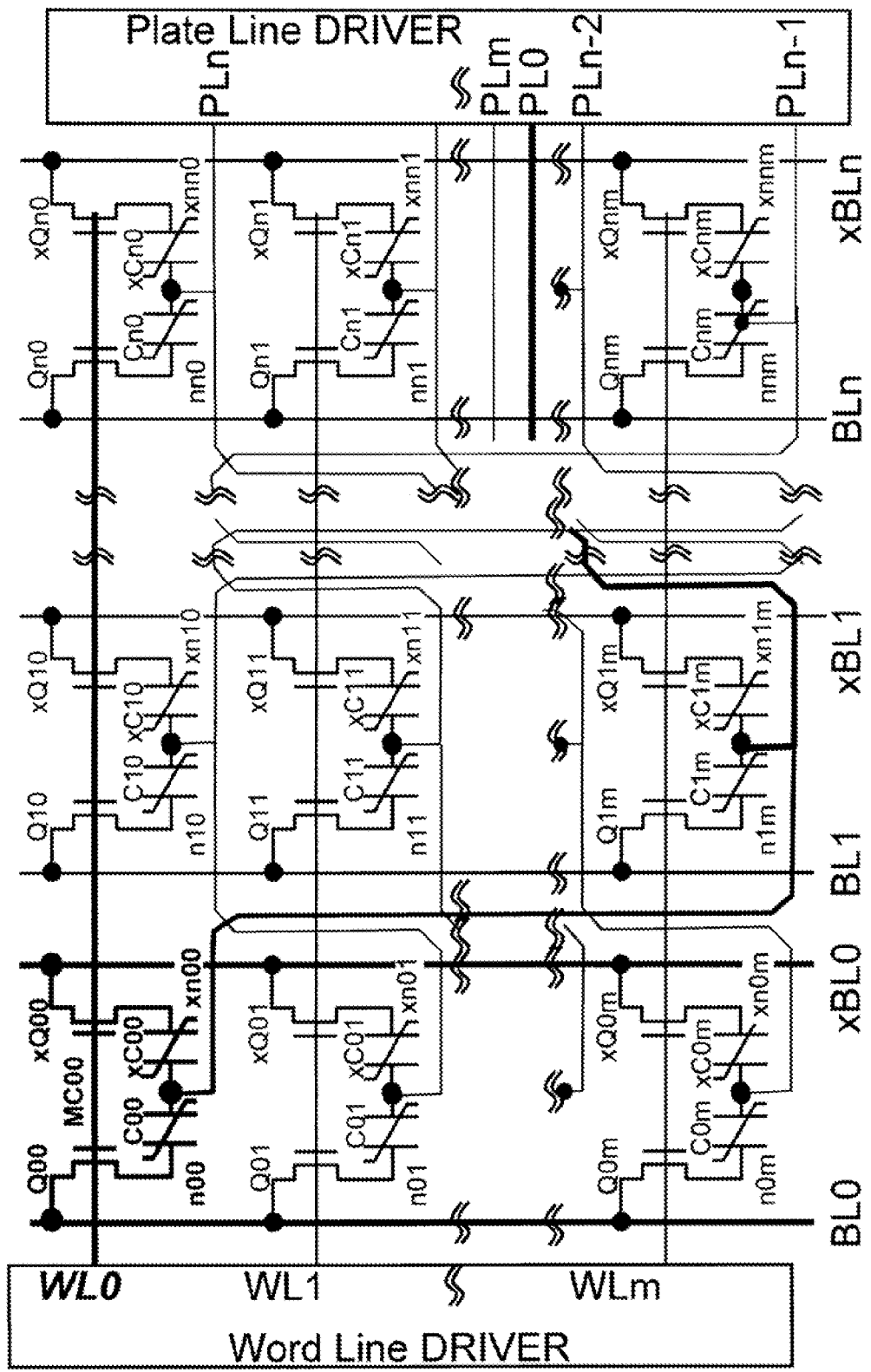
FIG. 17 depicts another example of a memory cell array of this embodiment.

FIG. 17 depicts another example of a memory cell array of this embodiment. This is an example of cyclic type plate lines PL. With these plate lines PL, the memory cell MC00 is selected by the word line WL0 and plate line PL0. If PL and WL are not selected simultaneously, because unselected BLs and xBLs are kept GND level, the polarization direction of capacitors in the memory cell is maintained and is not destroyed. The plate line group PL0 to PLm are connected to n memory cells in the row of the word line WL one lower at each different bit line BL in the horizontal direction. However, upon reaching the word line WLm, the plate line group are routed up to the word line WL0, and from these plate line group are connected to the memory cell in the row of the word line WL one lower at every different bit line BL. In this cyclic type, plate line drivers for stair-shape plate lines PL0* to PLn-1*, as in FIG. 16, are unnecessary, and the area required can be reduced. Further, when m=kn (where k is an integer), this is called k sets of n cycles, and the wiring length of wiring parallel to the bit lines BL of vertical-direction plate lines PL can be shortened.

Here a stair shape type and cyclical type of plate lines PL have been depicted; but plate lines PL can be made horizontal memory rows, with word lines WL arranged in a stair shape or a cyclic manner. In this case, the word lines WL are connected with memory cells in the rows of plate lines PL one row below for each different bit line BL.

BGS method delayed writing in the second embodiment can be applied to the plate line layout examples of FIG. 14 to FIG. 17 as well. In the case of the BGS method, as depicted in FIG. 9, a common QV amplifier, latch amplifier and write amplifier are provided for a plurality of bit line pairs, and so in this respect cell array of FIG. 14, 16, 17 can be connected to FIG. 9 at BLs and xBLs. However, for driving the cell array of FIG. 15, BGS sense circuit in FIG. 9 shall be modified to have as many BUS, QVA, LA and WA as BLs being driven simultaneously by a PL.

(1T1C Memory Cells)

Figure 18:
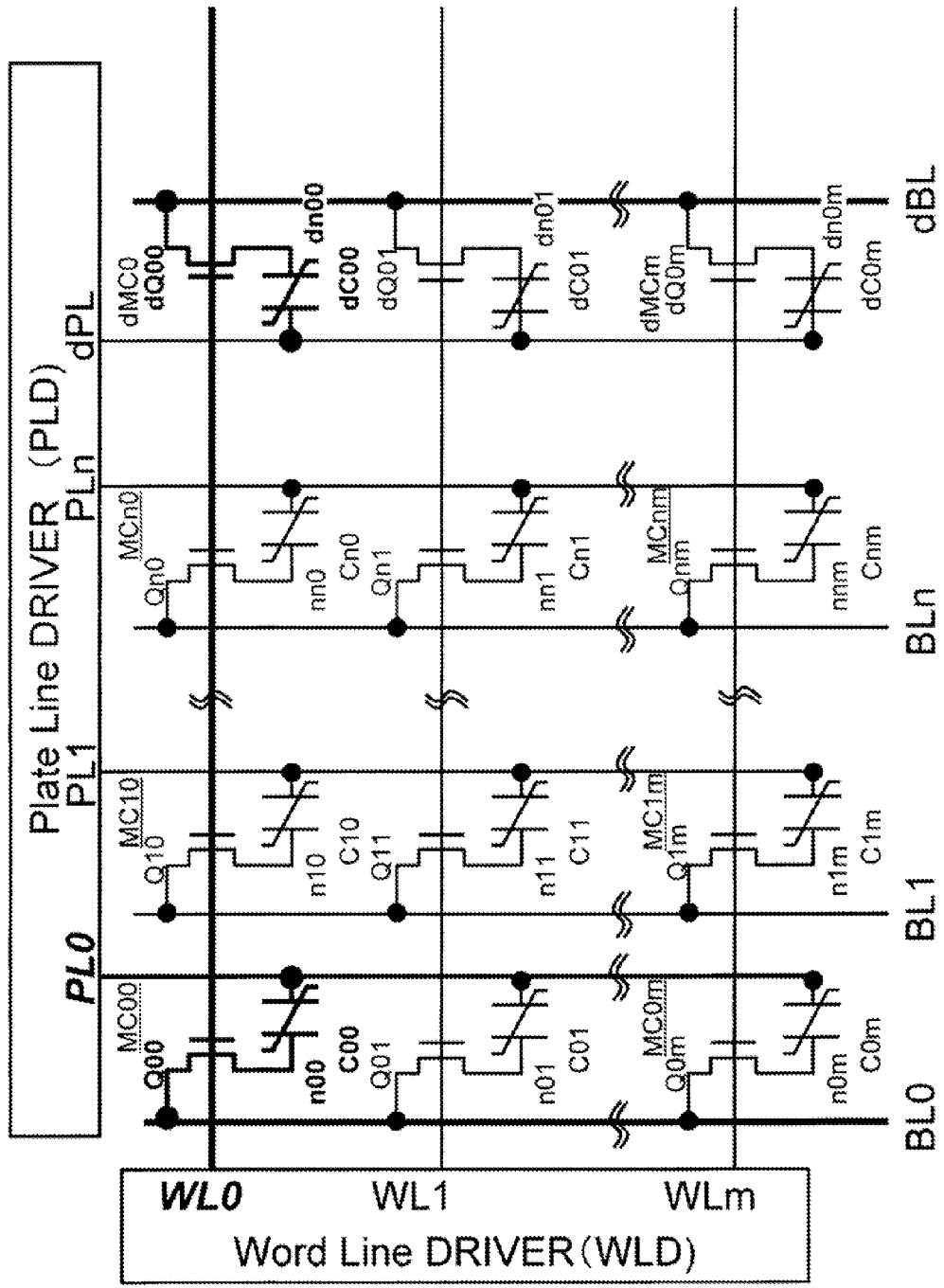
FIG. 18 depicts another example of a memory cell array of this embodiment.

FIG. 18 depicts another example of a memory cell array of this embodiment. The normal memory cells MC00 to MCnm of FIG. 18 are 1T1C type cells having one access gate Q00-Qnm and one ferroelectric capacitor C00-Cnm. A plurality of bit lines BL0 to BLn and one dummy bit line dBL are provided. On the dummy bit line dBL are arranged dummy cells dMC0 to dMCm of 1T1C type having one access gate dQ00 to dQ0m and one ferroelectric capacitor dC00 to dC0m.

In the case of this 1T1C type configuration, the bit line connected to the selected memory cell among the bit lines BL0-n and the dummy bit line dBL are controlled equivalently to a bit line pair BL, xBL in FIG. 3 to FIG. 8 and FIG. 10 to FIG. 13. And, in delayed writing, in the first timing sequence the word line WL is driven, the plate line is driven, and the charge output to the bit line from the ferroelectric capacitor of the selected memory cell is transmitted to the latch amplifier (in BGS case, through QV amplifier to the latch amplifier), after which the selected bit line BL is returned to GND level. By this means, data (0) is written to the ferroelectric capacitor in the selected cell, regardless of the stored data or the write data. And, in the second timing sequence, only when the write data or the rewrite data is data (1), the write amplifier drives the selected bit line BL from GND level to VDD level, and data (1) is written to the ferroelectric capacitor in the selected memory cell.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A ferroelectric memory device, comprising:
a plurality of word lines;
a plurality of bit lines intersecting the word lines;
a plurality of plate lines;
a plurality of memory cells which are disposed at the positions of intersection of the word lines and bit lines, and which respectively have an access gate which connects to the word line and the bit line, and a ferroelectric capacitor provided between the access gate and the plate line;

a latch amplifier, which latches stored data according to an amount of charge output to the bit lines from the ferroelectric capacitors; and a write amplifier, which drives the bit lines according to write data or according to the latched stored data, wherein the bit lines are precharged to a reference potential by beginning of an active period;

in the active period, at a first time a selected word line of the plurality of word lines is driven according to an input address, and the plate line is driven from the reference potential to a high-level potential being higher than the reference potential so that the ferroelectric capacitor is caused to output electric charge to a selected bit line of the plurality of bit lines, and thereafter at a second time, the selected bit line is brought to the reference potential regardless of the write data or the latched stored data so that first data is written to a selected memory cell of the plurality of memory cells, and thereafter at a third time, the plate line is driven to the reference potential and is maintained at the reference potential together with the selected bit line; and in a precharge period after the active period, the write amplifier drives the selected bit line from the reference potential to the high-level potential when the write data or the latched stored data is high-level so that second data is written to the selected memory cell.

2. The ferroelectric memory device according to claim 1, wherein, in the active period, at the first time, the potential of the selected bit line rises according to the amount of charge output from the ferroelectric capacitor to the bit line, and at the second time, the latch amplifier latches the stored data according to the potential of the selected bit line, and moreover the latch amplifier is separated from the selected bit line, and the selected bit line is driven to the reference potential.

3. The ferroelectric memory device according to claim 2, wherein the access gate includes a pair of the access gates which connect to a pair of the bit lines respectively, and the ferroelectric capacitor includes a pair of ferroelectric capacitors;

at the second time, a pair of the selected bit lines are both driven to the reference potential so that the first data is written to the pair of ferroelectric capacitors; and in the precharge period, the write amplifier drives one of the pair of selected bit lines from the reference potential to the high-level potential so that the second data is written to one of the ferroelectric capacitors in the selected memory cell.

4. The ferroelectric memory device according to claim 2, wherein the memory cells have one access gate and one ferroelectric capacitor respectively;

at the second time, the selected bit line is driven to the reference potential regardless of the write data or the latched stored data so that the first data is written to the ferroelectric capacitor in the selected memory cell; and in the precharge period, when the write data or the latched stored data is the second data, the write amplifier drives the selected bit line from the reference potential to the high-level potential so that the second data is written to the ferroelectric capacitor in the selected memory cell.

5. The ferroelectric memory device according to claim 1, further comprising a charge/voltage conversion amplifier which, at the first time, converts the charge amount output to the selected bit line into a voltage, and maintains the selected bit line at the reference potential, wherein at the second time, the latch amplifier senses the voltage converted by the charge/voltage conversion amplifier and latches the stored data.

6. The ferroelectric memory device according to claim 5, wherein the access gate includes a pair of the access gates which connect to a pair of the bit lines respectively, and the ferroelectric capacitor includes a pair of ferroelectric capacitors;

at the second time, a pair of the selected bit lines are both maintained at the reference potential so that the first data is written to the pair of ferroelectric capacitors; and in the precharge period, the write amplifier drives one of the pair of selected bit lines from the reference potential to the high-level potential so that the second data is written to one ferroelectric capacitor in the selected memory cell.

7. The ferroelectric memory device according to claim 5, wherein the memory cells have one access gate and one ferroelectric capacitor respectively;

at the second time, the selected bit line is maintained at the reference potential so that the first data is written to the ferroelectric capacitor in the selected memory cell regardless of the write data or the latched stored data; and in the precharge period, when the write data or the latched stored data is the second data, the write amplifier drives the selected bit line from the reference potential to the high-level potential so that the second data is written to the ferroelectric capacitor in the selected memory cell.

8. The ferroelectric memory device according to claim 2, wherein the latch amplifier and the write amplifier are provided in common for a plurality of bit lines, at the first time the selected bit line is connected to the latch amplifier, and in the precharge period the selected bit line is connected to the write amplifier.

9. The ferroelectric memory device according to claim 2, wherein, in the active period, unselected bit lines of the plurality of bit lines are maintained at the reference potential, and plate lines of unselected memory cells connected to the selected word line are not driven to the high-level potential.

10. The ferroelectric memory device according to claim 2, wherein the plate lines are disposed along the bit lines, and in the active period, unselected bit lines of the plurality of bit lines are maintained at the reference potential.

11. The ferroelectric memory device according to claim 5, wherein the latch amplifier and the write amplifier are provided in common for the plurality of bit lines, at the first time the selected bit line is connected to the latch amplifier, and in the precharge period the selected bit line is connected to the write amplifier.

12. The ferroelectric memory device according to claim 5, wherein, in the active period, unselected bit lines of the plurality of bit lines are maintained at the reference potential, and plate lines of unselected memory cells connected to the selected word line are not driven to the high-level potential.

13. The ferroelectric memory device according to claim 5, wherein the plate lines are disposed along the bit lines, and in the active period, unselected bit lines of the plurality of bit lines are maintained at the reference potential.

14. A ferroelectric memory device, comprising:
a plurality of word lines;
a plurality of bit line pairs intersecting the word lines;
a plurality of plate lines;
a plurality of memory cells which are disposed at positions of intersection of the word lines and bit line pairs, and which respectively have a pair of access gates which connects to the word line and the bit line pair, and a pair of ferroelectric capacitors respectively provided between the pair of access gates and the plate line;
a latch amplifier, which latches stored data according to an amount of charge output to the bit line pairs from the ferroelectric capacitors; and
a write amplifier, which drives the bit line pairs according to write data or according to the latched stored data, wherein
the bit line pairs are precharged to a reference potential by beginning of an active period;
in the active period, at a first time a selected word line of the plurality of word lines is driven according to an input address, and the plate line is driven from the reference potential to a high-level potential being higher than the reference potential so that the pair of ferroelectric capacitors are caused to output electric charge to a selected bit line pair of the plurality of bit line pairs, and thereafter at a second time, the selected bit line pair are both brought to the reference potential so that first data is written to the pair of ferroelectric capacitors of the a selected memory cell of the plurality of memory cells, and thereafter at a third time, the plate line is driven to the reference potential and is maintained at the reference potential together with the selected bit line pair; and
in a precharge period after the active period, the write amplifier drives one of the bit line of the selected bit line pair from the reference potential to the high-level potential according to write data or to the latched stored data so that second data is written to the corresponding ferroelectric capacitor of the selected memory cell.

15. A writing method for a ferroelectric memory device having: a plurality of word lines; a plurality of bit lines intersecting the word lines; a plurality of plate lines;
a plurality of memory cells which are disposed at positions of intersection of the word lines and bit lines, and which respectively have an access gate which connects to the word line and the bit line, and a ferroelectric capacitor provided between the access gate and the plate line;
a latch amplifier, which latches stored data according to an amount of charge output to the bit lines from the ferroelectric capacitors; and
a write amplifier, which drives the bit lines according to write data or according to the latched stored data,
the method comprising:
precharging the bit lines to a reference potential by beginning of an active period;
driving, in the active period, at a first time, a selected word line of the plurality of word lines according to an input address, and driving the plate line from the reference potential to a high-level potential being higher than the reference potentional so as to cause electric charge to be output from the ferroelectric capacitor to a selected bit line of the plurality of bit lines, and at a subsequent second time, driving the selected bit line to the reference potential regardless of the write data or the latched stored data so as to write first data to a selected memory cell of the plurality of memory cells, and at a subsequent third time, driving the plate line to the reference potential and maintaining the plate line together with the selected bit line at the reference potential; and
driving, in a precharge period after the active period, by the write amplifier, the selected bit line from the reference potential to the high-level potential when the write data or the latched stored data is high-level so as to write second data to the selected memory cell.

* * * * *